(12) United States Patent
Tokunaga et al.

(10) Patent No.: US 9,054,197 B2
(45) Date of Patent: Jun. 9, 2015

(54) THIN-FILM TRANSISTOR, DISPLAY UNIT, AND ELECTRONIC APPARATUS

(71) Applicant: Sony Corporation, Tokyo (JP)

(72) Inventors: Kazuhiko Tokunaga, Kanagawa (JP); Toshiaki Arai, Kanagawa (JP)

(73) Assignee: SONY CORPORATION (JP)

( * ) Notice: Subject to any disclaimer, the term of this patent is extended or adjusted under 35 U.S.C. 154(b) by 1 day.

(21) Appl. No.: 13/746,562

(22) Filed: Jan. 22, 2013

(65) Prior Publication Data

US 2013/0200364 A1    Aug. 8, 2013

(30) Foreign Application Priority Data

Feb. 3, 2012 (JP) ................ 2012-021502

(51) Int. Cl.
*H01L 29/78*     (2006.01)
*H01L 29/786*    (2006.01)

(52) U.S. Cl.
CPC ...... *H01L 29/78636* (2013.01); *H01L 29/7869* (2013.01); *H01L 29/78696* (2013.01)

(58) Field of Classification Search
CPC .............. H01L 27/1214; H01L 27/12; H01L 29/66742; H01L 29/7869; H01L 27/1225; H01L 29/66969; H01L 29/78693; H01L 21/02565

USPC ........ 257/E21.411, E21.632, 43, 66, E29.273
See application file for complete search history.

(56) References Cited

U.S. PATENT DOCUMENTS

| | | | |
|---|---|---|---|
| 2011/0024763 A1* | 2/2011 | Noda et al. ..................... | 257/72 |
| 2012/0007084 A1* | 1/2012 | Park et al. ...................... | 257/59 |
| 2012/0305930 A1* | 12/2012 | Makita et al. .................. | 257/72 |

FOREIGN PATENT DOCUMENTS

JP       2010-135462 A     6/2010
WO    WO 2011096387 A1 *   8/2011

* cited by examiner

*Primary Examiner* — Chuong A Luu
*Assistant Examiner* — Rodolfo Fortich
(74) *Attorney, Agent, or Firm* — Sheridan Ross P.C.

(57) ABSTRACT

A thin-film transistor includes: a gate electrode; a gate insulating film disposed on the gate electrode; an oxide semiconductor layer disposed on the gate insulating film and having a channel region located to face the gate electrode; a channel protective layer disposed on the gate insulating film and the oxide semiconductor layer; and source and drain electrodes each connected to the oxide semiconductor layer through a connection hole formed in the channel protective layer, in which the oxide semiconductor layer has, in a part of the channel region, a narrow region with a narrower width than a width of the connection hole.

15 Claims, 25 Drawing Sheets

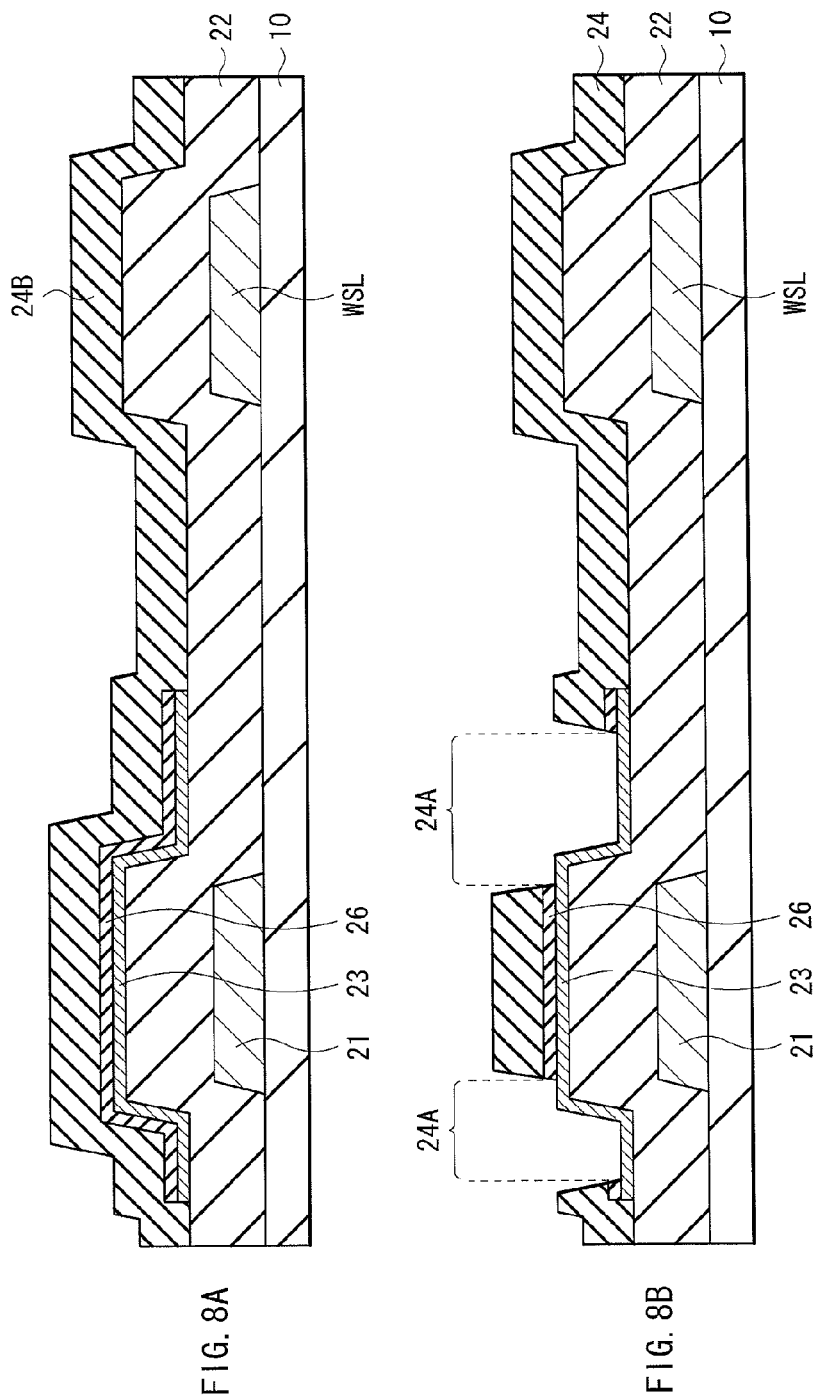

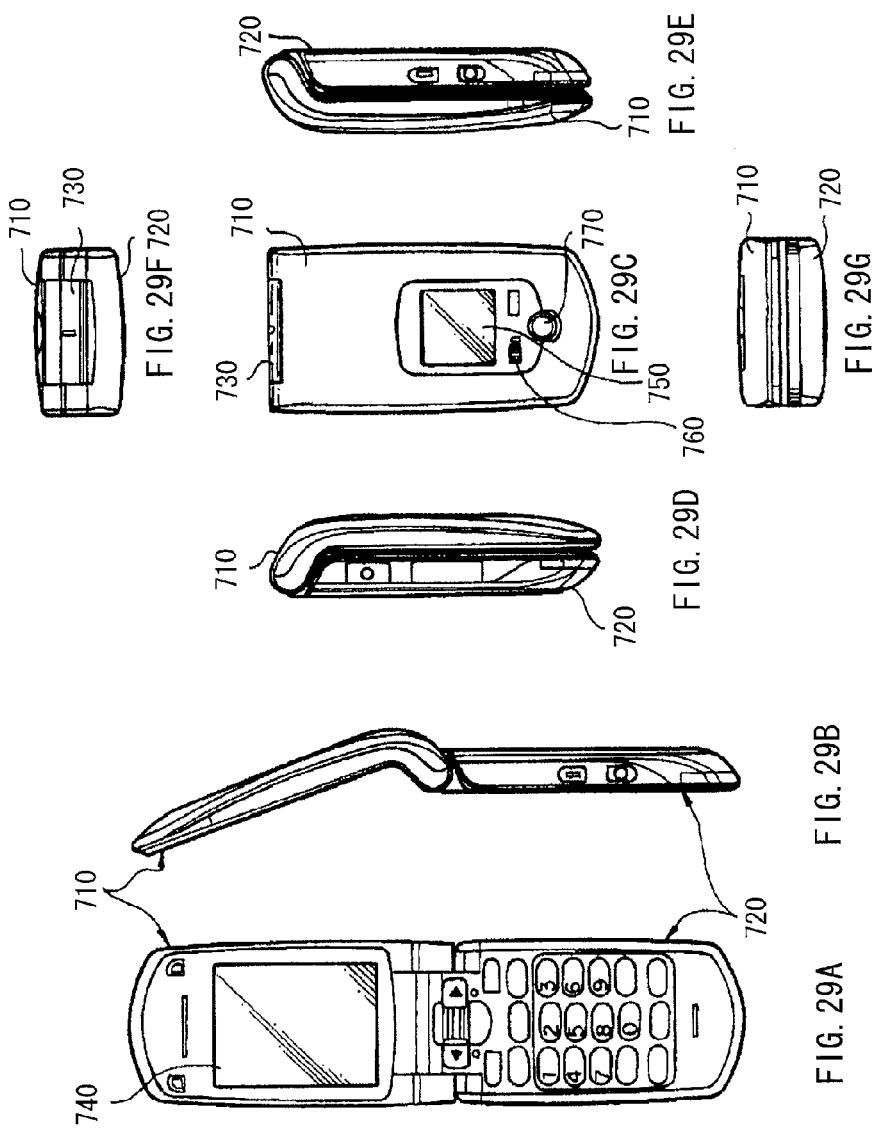

THIN-FILM TRANSISTOR, DISPLAY UNIT, AND ELECTRONIC APPARATUS

BACKGROUND

The present disclosure relates to a thin-film transistor using an oxide semiconductor, a display unit including the thin-film transistor, and an electronic apparatus including the display unit.

It is known that oxides of zinc, indium, gallium, tin, and mixtures thereof (hereinafter referred to as "oxide semiconductors") exhibit favorable semiconductor properties, and in recent years, applications of the oxide semiconductors to thin-film transistors (hereinafter referred to as "TFTs") as drive devices of active matrix display units have been actively studied. For example, a mixed oxide of zinc, indium, and gallium (hereinafter referred to as "IGZO") exhibits electron mobility 10 or more times as high as that of amorphous silicon used as a semiconductor in related art; therefore, applications of IGZO to large-screen high-definition high-frame-rate liquid crystal display units and organic EL display units are strongly desired.

For the formation of a bottom-gate TFT, it is proposed to form a channel protective layer on an entire surface of an oxide semiconductor layer and to connect source and drain electrodes to the oxide semiconductor layer through connection holes (contact holes) formed in the channel protective layer (for example, refer to Japanese Unexamined Patent Application Publication No. 2010-135462). By doing so, the TFT is formed with use of fewer masks while protecting the oxide semiconductor layer by the channel protective film during a process of forming the TFT.

SUMMARY

However, in the method described in Japanese Unexamined Patent Application Publication No. 2010-135462, a channel width (W) is determined by a width of the connection hole formed in the channel protective layer; therefore, the channel width may vary due to variations in etching of the channel protective layer, and there is still room for improvement.

It is desirable to provide a thin-film transistor capable of suppressing variations in channel width, a display unit including the thin-film transistor, and an electronic apparatus.

According to an embodiment of the disclosure, there is provided a thin-film transistor including: a gate electrode; a gate insulating film disposed on the gate electrode; an oxide semiconductor layer disposed on the gate insulating film and having a channel region located to face the gate electrode; a channel protective layer disposed on the gate insulating film and the oxide semiconductor layer; and source and drain electrodes each connected to the oxide semiconductor layer through a connection hole formed in the channel protective layer, in which the oxide semiconductor layer has, in a part of the channel region, a narrow region with a narrower width than a width of the connection hole.

Here, "width" means a dimension in a channel width direction. The channel width direction is a direction orthogonal to a channel length (a distance between source and drain electrodes) direction.

In the thin-film transistor according to the embodiment of the disclosure, since the narrow region with a narrower width than the width of the connection hole is disposed in a part of the channel region of the oxide semiconductor layer, a channel width (W) is determined by the width of the narrow region. Therefore, even if the width of the connection hole is varied due to variations in etching of the channel protective layer, variations in the channel width are suppressed.

According to an embodiment of the disclosure, there is provided a display unit including a display device and a thin-film transistor driving the display device, the thin-film transistor including: a gate electrode; a gate insulating film disposed on the gate electrode; an oxide semiconductor layer disposed on the gate insulating film and having a channel region located to face the gate electrode; a channel protective layer disposed on the gate insulating film and the oxide semiconductor layer; and source and drain electrodes each connected to the oxide semiconductor layer through a connection hole formed in the channel protective layer, in which the oxide semiconductor layer has, in a part of the channel region, a narrow region with a narrower width than a width of the connection hole.

In the display unit according to the embodiment of the disclosure, the display device is driven by the thin-film transistor according to the above-described embodiment of the disclosure in which variations in the channel width are suppressed. Therefore, variations in transistor characteristics caused by variations in the channel width are reduced to suppress a decline in display quality such as luminance unevenness.

According to an embodiment of the disclosure, there is provided an electronic apparatus with a display unit including a display device and a thin-film transistor driving the display device, the thin-film transistor including: a gate electrode; a gate insulating film disposed on the gate electrode; an oxide semiconductor layer disposed on the gate insulating film and having a channel region located to face the gate electrode; a channel protective layer disposed on the gate insulating film and the oxide semiconductor layer; and source and drain electrodes each connected to the oxide semiconductor layer through a connection hole formed in the channel protective layer, in which the oxide semiconductor layer has, in a part of the channel region, a narrow region with a narrower width than a width of the connection hole.

In the electronic apparatus according to the embodiment of the disclosure, a display operation is performed by the display unit according to the above-described embodiment of the disclosure.

In the thin-film transistor according to the embodiment of the disclosure, since the narrow region with a narrower width than the width of the connection hole is disposed in a part of the channel region of the oxide semiconductor layer, variations in the channel width caused by variations in etching of the channel protective layer is suppressible. Therefore, when the display unit or the electronic apparatus is configured with use of the thin-film transistor, high-quality display is achievable by the thin-film transistor with reduced variations in characteristics caused by variations in the channel width.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

FIGS. 8A and 8B are diagrams illustrating manufacturing processes following FIGS. 7A and 7B.

FIGS. 29A to 29G illustrate Application Example 7, where FIGS. 29A and 29B are a front view and a side view in a state in which Application Example 7 is opened, respectively, and FIGS. 29C, 29D, 29E, 29F, and 29G are a front view, a left side view, a right side view, a top view, and a bottom view in a state in which Application Example 7 is closed, respectively.

DETAILED DESCRIPTION

Preferred embodiments of the disclosure will be described in detail below referring to the accompanying drawings. It is to be noted that description will be given in the following order.

1. First Embodiment (Organic EL display unit; an example in which a narrow region is disposed in a part of a channel region, and corners of an oxide semiconductor layer protrude from source and drain electrodes)

2. Modification 1 (An example in which two sides facing each other in a channel width direction of the oxide semiconductor layer protrude from the source and drain electrodes)

3. Modification 2 (An example in which one of two sides facing each other in the channel width direction of the oxide semiconductor layer protrudes from the source and drain electrodes)

3. Modification 3 (An example in which the oxide semiconductor layer is exposed from an channel protective layer and the source and drain electrodes in a part of a connection hole)

4. Modification 4 (An example adopting a combination of Modifications 1 and 3)

5. Second Embodiment (Liquid crystal display unit)

6. Third Embodiment (Electronic paper display unit)

7. Application Examples (Module, electronic apparatuses)

(First Embodiment)

Figure 1:
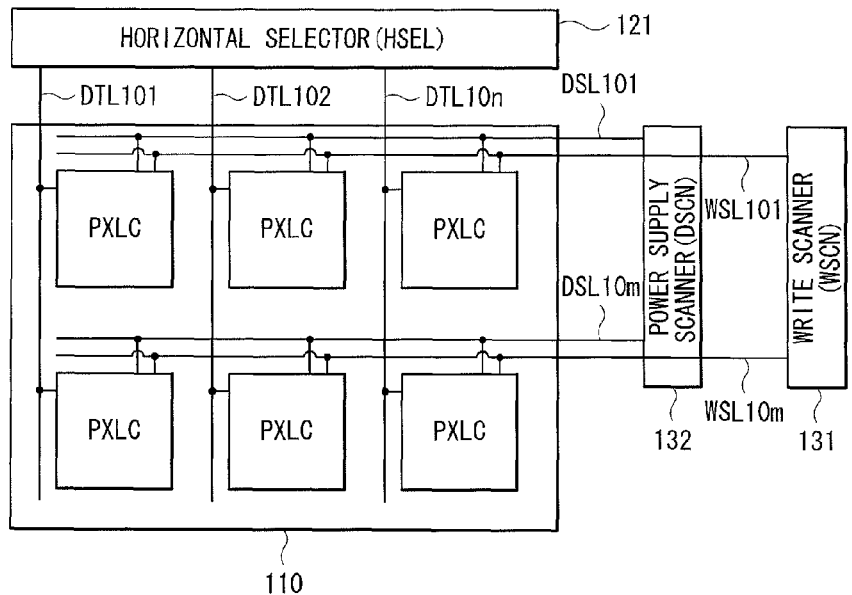
FIG. 1 is a diagram illustrating a configuration of a display unit according to a first embodiment of the disclosure.

FIG. 1 illustrates a configuration of a display unit according to a first embodiment of the disclosure. The display unit is used as an ultra-thin organic light-emitting color display unit or the like, and has, on a TFT substrate 1 which will be described later, a display region 110 in which pixels PXLC configured of a plurality of organic light-emitting devices 10R, 10G, and 10B which will be described later as display devices are arranged in a matrix. A horizontal selector (HSEL) 121 as a signal section, and a write scanner (WSCN) 131 and a power supply scanner (DSCN) 132 as scanner sections are disposed around the display region 110.

In the display region 110, signal lines DTL101 to DTL10n are arranged in a column direction, and scanning lines WSL101 to WSL10m and power supply lines DSL101 to DSL10m are arranged in a row direction. A pixel circuit 140 including the pixel PXLC (any one of the organic light-emitting devices 10R, 10G and 10B (sub-pixels)) is disposed at an intersection of each signal line DTL and each scanning line WSL. The signal lines DTL are connected to the horizontal selector 121, and image signals are supplied from the horizontal selector 121 to the signal lines DTL. The scanning lines WSL are connected to the write scanner 131. The power supply lines DSL are connected to the power supply scanner 132.

Figure 2:
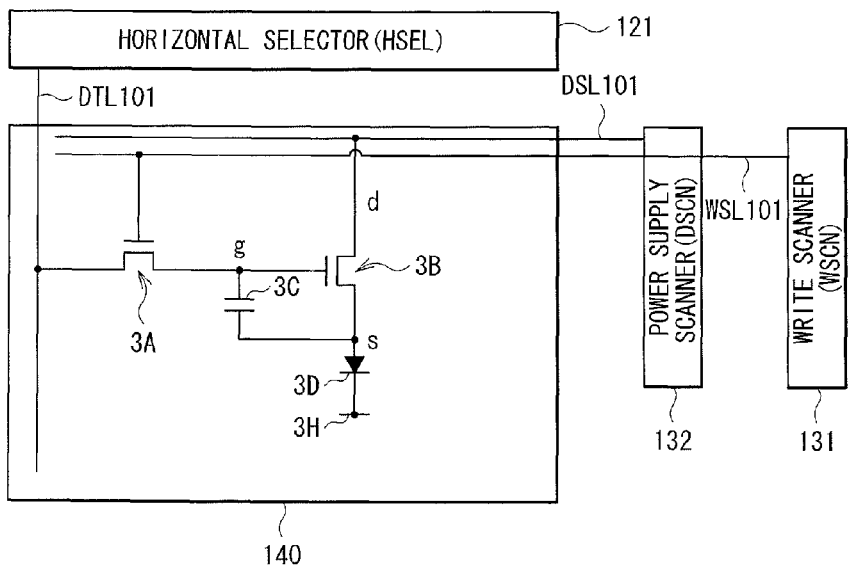
FIG. 2 is an equivalent circuit diagram illustrating an example of a pixel drive circuit illustrated in FIG. 1.

FIG. 2 illustrates an example of the pixel circuit 140. The pixel circuit 140 is an active drive circuit including a sampling transistor 3A and a driving transistor 3B, a retention capacitor 3C, and a light-emitting device 3D configured of the pixel PXLC. A gate of the sampling transistor 3A is connected to a corresponding scanning line WSL101, and one of a source and a drain of the sampling transistor 3A is connected to a corresponding signal line DTL101, and the other of them is connected to a gate g of the driving transistor 3B. A drain d of the driving transistor 3B is connected to a corresponding power supply line DSL101, and a source s of the driving transistor 3B is connected to an anode of the light-emitting device 3D. A cathode of the light-emitting device 3D is connected to ground wiring 3H. It is to be noted that the ground wiring 3H is installed as common wiring for all of the pixels PXLC. The retention capacitor 3C is connected between the source s and the gate g of the driving transistor 3B.

The sampling transistor 3A is brought into conduction based on a control signal supplied from the scanning line WSL101 to sample a signal potential of an image signal supplied from the signal line DTL and then to retain the signal potential in the retention capacitor 3C. The driving transistor 3B receives a current from the power supply line DSL101 which is maintained at a power supply potential to supply a drive current to the light-emitting device 3D based on the signal potential retained in the retention capacitor 3C. The light-emitting device 3D emits light with luminance according to the signal potential of the image signal by the drive current supplied from the driving transistor 3B.

Figure 3:
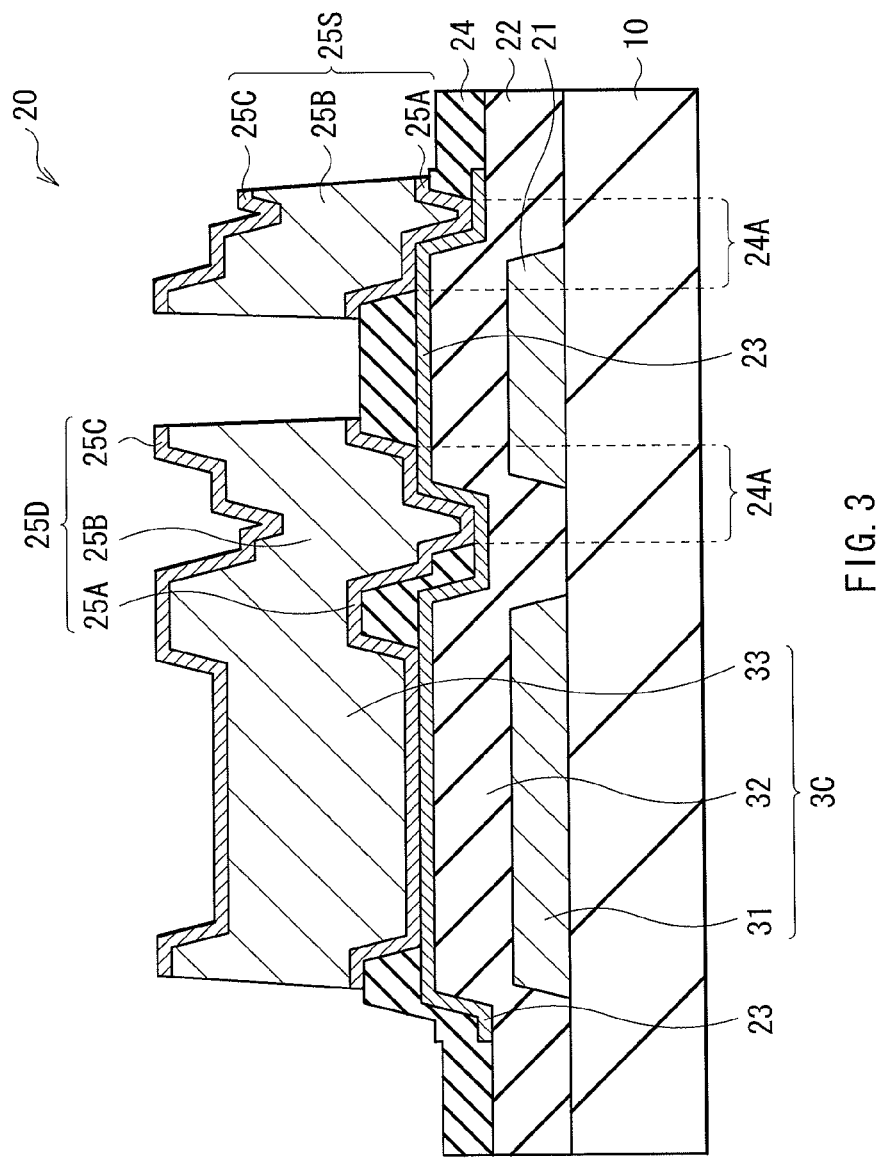
FIG. 3 is a sectional view illustrating a configuration of a TFT illustrated in FIG. 2.

FIG. 3 illustrates a sectional configuration of the TFT 20 configuring the sampling transistor 3A illustrated in FIG. 2. Moreover, FIG. 3 also illustrates the retention capacitor 3C illustrated in FIG. 2. It is to be noted that the driving transistor 3B illustrated in FIG. 2 has a configuration similar to the TFT 20 illustrated in FIG. 3.

The TFT 20 is, for example, an oxide semiconductor transistor including a gate electrode 21, a gate insulating film 22, an oxide semiconductor layer 23, a channel protective layer 24, a source electrode 25S, and a drain electrode 25D in this order on a substrate 10. Here, an "oxide semiconductor" is an oxide of any one of zinc, indium, gallium, and tin or an oxide of a mixture thereof, and it is known that the oxide semiconductor exhibits favorable semiconductor characteristics.

The gate electrode 21 controls electron density in the oxide semiconductor layer 23 by a gate voltage applied to the TFT 20, and has a thickness of, for example, about 200 nm or less, and is made of, for example, molybdenum (Mo).

The gate insulating film 22 is configured of, for example, a silicon oxide film with a thickness of about 300 nm or less. Moreover, the gate insulating film 22 may be configured of a laminate film including a silicon oxide film and a silicon nitride film.

The oxide semiconductor layer 23 has a thickness of, for example, about 40 nm, and is made of, for example, indium gallium zinc oxide (IGZO (In—Ga—Zn-Oxide)). As the material of the oxide semiconductor layer 23, in addition to IGZO, indium tin zinc oxide (ITZO) as an amorphous oxide semiconductor may be used. As a crystalline oxide semiconductor, zinc oxide (ZnO), indium zinc oxide (IZO (registered trademark), indium gallium oxide, (IGO), ITO, indium oxide (InO), or the like may be used.

It is to be noted that, if necessary, a protective film (not illustrated in FIG. 3, refer to FIG. 7B) may be disposed on the oxide semiconductor layer 23. The protective film is configured of, for example, a silicon oxide film with a thickness of about 50 nm.

The channel protective layer 24 is a stopper layer protecting a channel region in a process of etching the source electrode 25S and the drain electrode 25D. The channel protective layer 24 is configured of, for example, a silicon oxide film with a thickness of about 200 nm.

The source electrode 25S and the drain electrode 25D each are connected to the oxide semiconductor layer 23 through a connection hole 24A formed in the channel protective layer 24. The source electrode 25S and the drain electrode 25D each are configured of any one of metals such as molybdenum, aluminum, and titanium, or a multilayer film of the metals. Preferably, an example of specific configurations of the source electrode 25S and the drain electrode 25D is a laminate film including a molybdenum layer 25A with a thickness of about 50 nm, an aluminum layer 25B with a thickness of about 200 nm to 1 µm both inclusive, and a titanium layer 25C with a thickness of about 50 nm in this order of closeness to the oxide semiconductor layer 23. It is to be noted that the source electrode 25S and the drain electrode 25D each may be configured of a laminate film including a molybdenum layer, an aluminum layer, and a molybdenum layer, or a laminate film including a titanium layer, an aluminum layer, and a titanium layer, depending on the use and application of the TFT 20.

It is to be noted that an entire surface of the TFT 20 may be covered with a passivation film (not illustrated), if necessary. The passivation film is made of a material similar to that of the gate insulating film 22 or the channel protective layer 24.

The retention capacitor 3C includes, for example, a lower electrode 31 located at the same level as the gate electrode 21, an insulating film 32 located at the same level as the gate insulating film 22, and an upper electrode 33 extending from the drain electrode 25D. It is to be noted that the oxide semiconductor layer 23 is also included in the retention capacitor 3C to reduce a difference in level between the retention capacitor 3C and the TFT 20.

Figure 4:
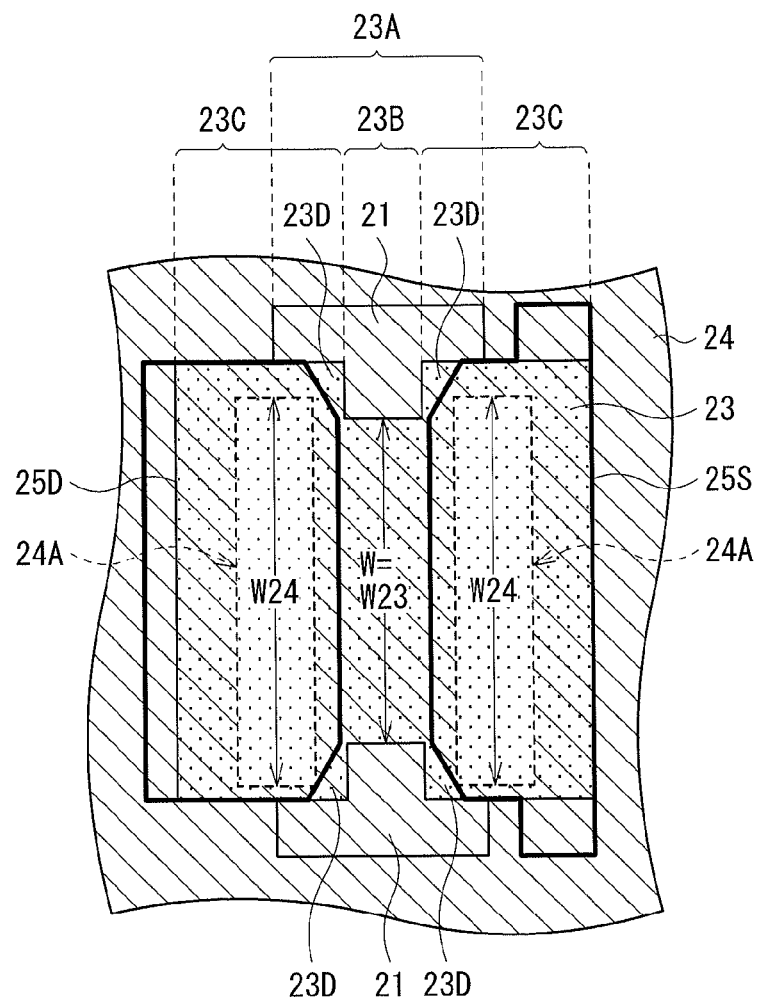
FIG. 4 is a plan view illustrating a configuration of the TFT illustrated in FIG. 3.
Figure 5:
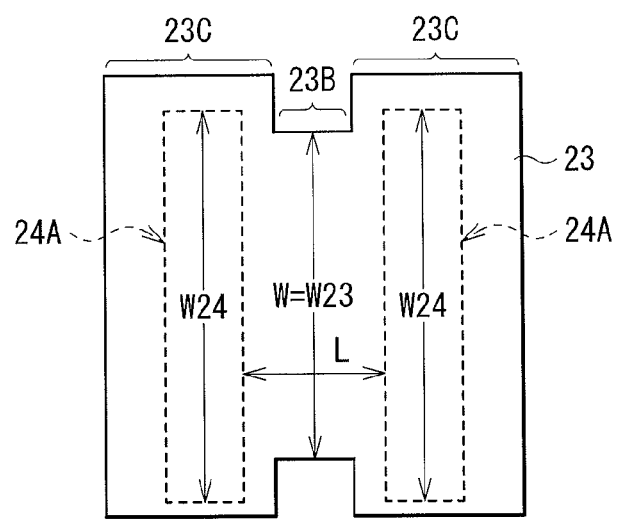
FIG. 5 is a plan view selectively illustrating an oxide semiconductor layer and a connection hole illustrated in FIG. 4.

FIG. 4 illustrates a planar configuration of the TFT 20 illustrated in FIG. 3 viewed from the source electrode 25S and the drain electrode 25D. In FIG. 4, a region where the oxide semiconductor layer 23 is disposed is shaded, and a region where the channel protective layer 24 is disposed is marked with diagonally right-down lines. FIG. 5 selectively illustrates the oxide semiconductor layer 23 and the connection hole 24A illustrated in FIG. 4.

The oxide semiconductor layer 23 has a channel region 23A located to face the gate electrode 21. A narrow region 23B is disposed in a part (for example, a central part in a channel length direction) of the channel region 23A. A width W23 of the narrow region 23B is narrower than a width W24 of the connection hole 24A. Therefore, in the TFT 20, variations in a channel width W are suppressed.

In other words, when the narrow region 23B is provided, the channel width W of the TFT 20 is determined by the width W23 of the narrow region 23B. Therefore, the channel width W is dimensionally stabilized irrespective of variations in the width W24 of the connection hole 24A in a manufacturing process. It is to be noted that a distance between two connection holes 24A is equal to a channel length L of the TFT 20.

The width W23 of the narrow region 23B is preferably determined to be narrower than the width W24 of the connection hole 24A, even if the width W24 of the connection hole 24A is minimized in consideration of variations in the width W24 of the connection hole 24A in the manufacturing process.

Moreover, the oxide semiconductor layer 23 has wide regions 23C in regions other than the narrow region 23B (regions on both sides of the narrow region 23B). The wide regions 23C are source and drain regions, that is, regions to which the source electrode 25S or the drain electrode 25D is connected through the connection hole 24A.

The wide regions 23C preferably have protruding portions 23D which protrude from the source electrode 25S and the drain electrode 25D and are located at four corners which surround the narrow region 23B. The protruding portions 23D serve as oxygen inlets in a recovery annealing (oxygen supply) process which will be described later on the oxide semiconductor layer 23, allowing transistor characteristics to be efficiently recovered for a short time.

Figure 6:
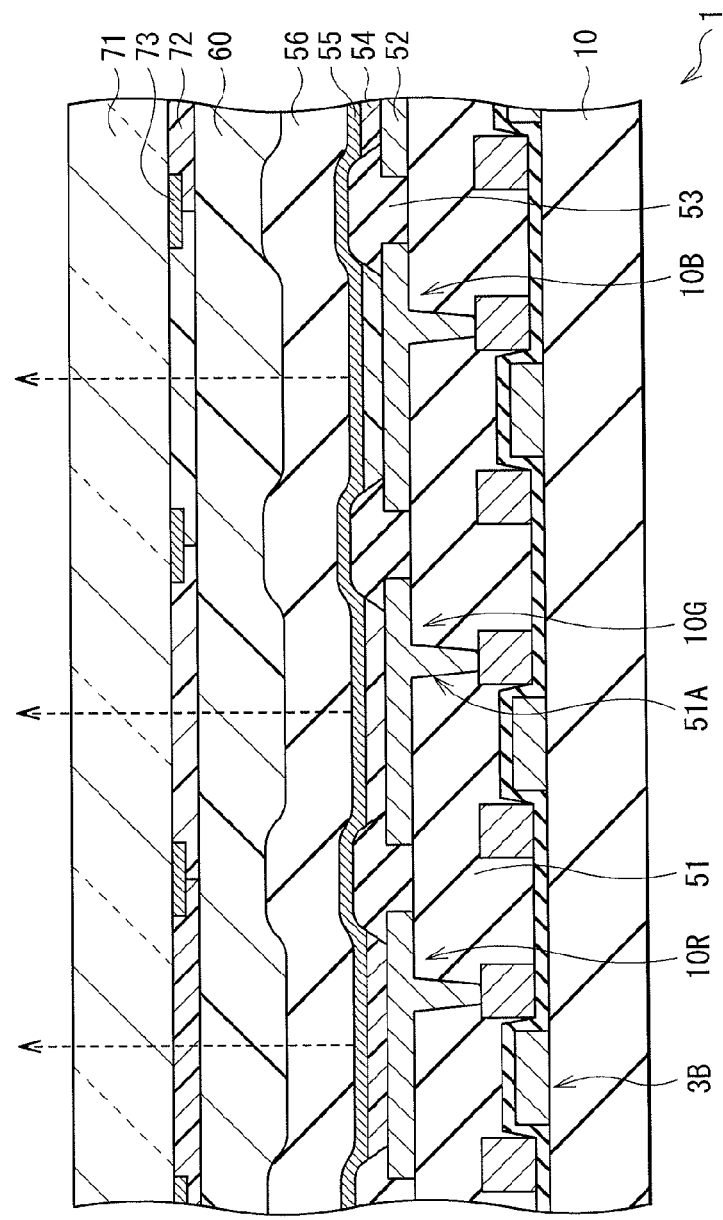
FIG. 6 is a sectional view illustrating a configuration of a display region illustrated in FIG. 1.

FIG. 6 illustrates a sectional configuration of the display region 110. In the display region 110, the organic light-emitting devices 10R emitting red light, the organic light-emitting devices 10G emitting green light, and the organic light-emitting devices 10B emitting blue light are formed in order in a matrix as a whole. It is to be noted that the organic light-emitting devices 10R, 10G, and 10B each have a rectangular planar shape, and one pixel is configured of a combination of adjacent organic light-emitting devices 10R, 10G, and 10B.

The organic light-emitting devices 10R, 10G, and 10B each have a configuration in which an anode 52, an inter-electrode insulating film 53, an organic layer 54 including a light-emitting layer which will be described later, and a cathode 55 are laminated in this order on the TFT substrate 1 with a planarization insulating film 51 in between.

Such organic light-emitting devices 10R, 10G, and 10B are covered with a protective film 56 such as a silicon nitride film or a silicon oxide film, if necessary, and a sealing substrate 71 made of glass or the like is bonded to an entire surface of the protective film 56 with an adhesive layer 60 made of a thermosetting resin or an ultraviolet curable resin in between to seal the organic light-emitting devices 10R, 10G, and 10B. A color filter 72 and a light-shielding film 73 as a black matrix may be disposed on the sealing substrate 71, if necessary.

The planarization insulating film 51 planarizes a surface of the TFT substrate 1 where the pixel circuits 140 each of which includes the sampling transistor 3A and the driving transistor 3B each configured of the above-described TFT 20 are formed. The planarization insulating film 51 is preferably made of a material with high pattern accuracy, since a minute connection hole 51A is formed in the planarization insulating film 51. Examples of the material of the planarization insulating film 51 include organic materials such as polyimide and inorganic materials such as silicon oxide ($SiO_2$). The driving transistor 3B illustrated in FIG. 2 is electrically connected to the anode 52 through the connection hole 51A formed in the planarization insulating film 51.

The anode 52 is formed corresponding to each of the organic light-emitting devices 10R, 10G, and 10B. Moreover, the anode 52 has a function as a reflective electrode reflecting light emitted from the light-emitting layer, and preferably has as high reflectivity as possible to enhance light emission efficiency. The anode 52 has a thickness of, for example, about 100 nm to 1000 nm both inclusive, and is made of a simple substance or an alloy of a metal element such as silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), or gold (Au).

The inter-electrode insulating film 53 secures insulation between the anode 52 and the cathode 55, and allows a light emission region to be accurately formed in a desired shape. The inter-electrode insulating film 53 is made of, for example, an organic material such as polyimide or an inorganic insulating material such as silicon oxide ($SiO_2$). The inter-electrode insulating film 53 has an opening corresponding to a light emission region of the anode 52. It is to be noted that the organic layer 54 and the cathode 55 may be continuously disposed not only on the light emission region but also on the inter-electrode insulating film 53; however, light is emitted only from the opening of the inter-electrode insulating film 53.

The organic layer 54 has a configuration in which, for example, a hole injection layer, a hole transport layer, the light-emitting layer, and an electron transport layer (all not illustrated) are laminated in this order of closeness to the anode 52; however, these layers other than the light-emitting layer may be included, if necessary. Moreover, the organic layer 54 may have a configuration different for each of colors emitted from the organic light-emitting devices 10R, 10G, and 10B. The hole injection layer enhances hole injection efficiency and is a buffer layer for preventing leakage. The hole transport layer enhances hole transport efficiency to the light-emitting layer. The light-emitting layer emits light by the recombination of electrons and holes in response to the application of an electric field. The electron transport layer enhances electron transport efficiency to the light-emitting layer. It is to be noted that the material of the organic layer 54 may be a typical low-molecular or polymer organic material, and is not specifically limited.

The cathode 55 has, for example, a thickness of about 5 nm to 50 nm both inclusive, and is made of a simple substance or an alloy of a metal element such as aluminum (Al), magnesium (Mg), calcium (Ca), or sodium (Na). In particular, an alloy of magnesium and silver (an MgAg alloy) or an alloy of aluminum (Al) and lithium (Li) (an AlLi alloy) is preferable. Moreover, the cathode 55 may be made of ITO or IZO (indium zinc oxide (registered trademark)).

The display unit may be manufactured by the following process, for example.

(Forming TFT Substrate 1)

FIGS. 7A and 7B to FIG. 9 illustrate a method of manufacturing the TFT 20 in sequence. It is to be noted that FIGS. 7A and 7B to FIG. 9 illustrate processes of manufacturing the TFT 20 on the left and processes of manufacturing a portion where wiring lines intersect with or overlap each other (for example, a portion where the scanning line WSL and the signal line DTL intersect with or overlap each other) on the right.

Figure 7A:
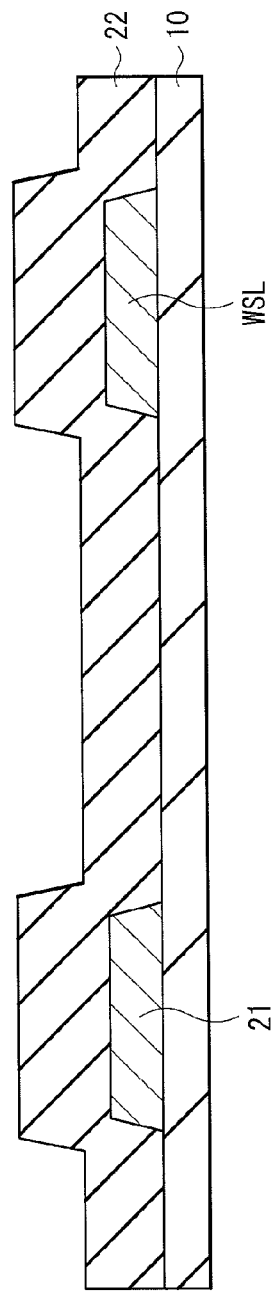
FIGS. 7A and 7B are sectional views illustrating a method of manufacturing the display unit illustrated in FIG. 1 in order.

First, the TFT 20 including the oxide semiconductor layer 23 is formed on the substrate 10 to form the TFT substrate 1. More specifically, a molybdenum film with a thickness of about 200 nm or less is formed on the substrate 10 made of glass by, for example, a sputtering method. Next, photolithography and etching are subjected to the molybdenum film. Thus, as illustrated in FIG. 7A on the left, the gate electrode 21 is formed in a region where the TFT 20 is to be formed. Moreover, as illustrated FIG. 7A on the right, wiring lines located at the same level as the electrode 21 (for example, the scanning lines WSL) are formed in the portion where the wiring lines intersect with or overlap each other.

Next, referring again to FIG. 7A, the gate insulating film 22 configured of a silicon oxide film with a thickness of about 300 nm or less is formed on an entire surface of the substrate 10 by, for example, a CVD (Chemical Vapor Deposition) method.

Figure 7B:
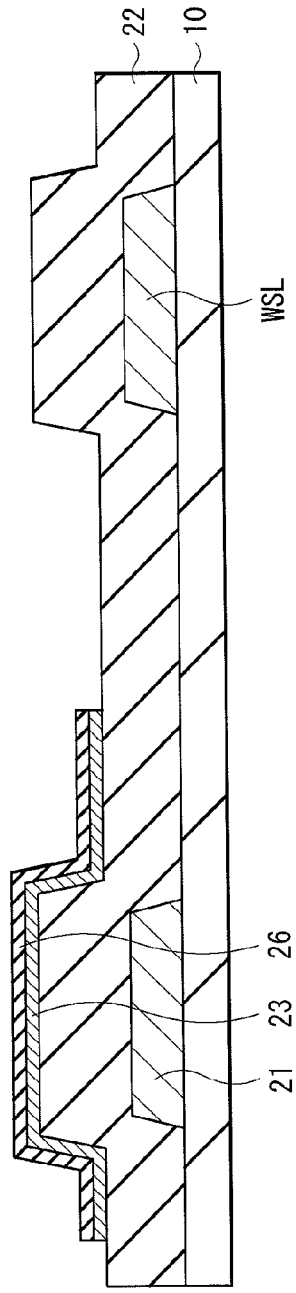

After that, an IGZO film (not illustrated) with a thickness of about 40 nm and a silicon oxide film (not illustrated) with a thickness of about 50 nm are formed on the gate insulating film 22, and the IGZO film and the silicon oxide film are formed into predetermined shapes by, for example, photolithography and etching. Thus, as illustrated in FIG. 7B on the left, the oxide semiconductor layer 23 and the protective film 26 are formed in the region where the TFT 20 is to be formed. At this time, the narrow region 23B is formed in a part of the channel region 23A of the oxide semiconductor layer 23. On the other hand, as illustrated in FIG. 7B on the right, in the portion where the wiring lines intersect with or overlap on each other, the oxide semiconductor layer 23 and the protective film 26 are removed.

It is to be noted that the oxide semiconductor layer 23 may be formed through directly performing photolithography and etching on the IGZO film without using the protective film 26.

After the oxide semiconductor layer 23 is formed, as illustrated in FIG. 8A, a silicon oxide film 24B is formed on the gate insulating film 22, the oxide semiconductor layer 23, and the protective film 26 by, for example, a CVD method.

Next, the silicon oxide film 24B and the protective film 26 are formed into predetermined shapes by, for example, photolithography and etching. Thus, as illustrated in FIG. 8B, the channel protective layer 24 having the connection holes 24A is formed.

Figure 9:
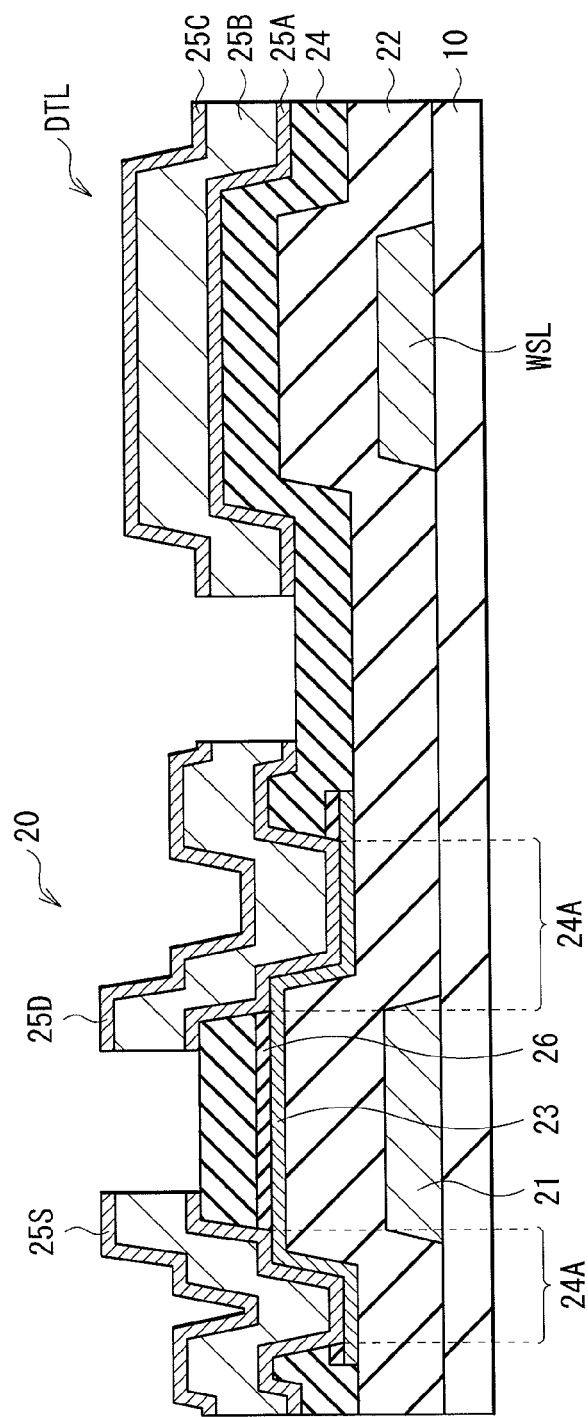
FIG. 9 is a diagram illustrating a manufacturing process following FIGS. 8A and 8B.

After that, a molybdenum layer 25A with a thickness of about 50 nm, an aluminum layer 25B with a thickness of about 500 nm, and a titanium layer 25C with a thickness of about 50 nm are formed by, for example, a sputtering method, and then are formed into predetermined shapes by photolithography and etching. Thus, as illustrated in FIG. 9 on the left, the source electrode 25S and the drain electrode 25D are formed in the region where the TFT 20 is to be formed. The source electrode 25S and the drain electrode 25D are connected to the oxide semiconductor layer 23 through the connection holes 24A. Thus, the TFT 20 illustrated in FIG. 3 is formed. On the other hand, as illustrated in FIG. 9 on the right, wiring lines (for example, the signal lines DTL) located at the same level as the source electrode 25S and the drain electrode 25D are formed in the portion where the wiring lines intersect with or overlap each other.

As illustrated in FIGS. 4 and 5, since the narrow region 23B is disposed in a part of the channel region 23A of the oxide semiconductor layer 23, the channel width W of the TFT 20 is determined by the width W23 of the narrow region 23B. Therefore, even if the width W24 of the connection hole 24A varies due to variations in etching of the channel protective layer 24, variations in the channel width W of the TFT 20 are suppressed.

Figure 10:
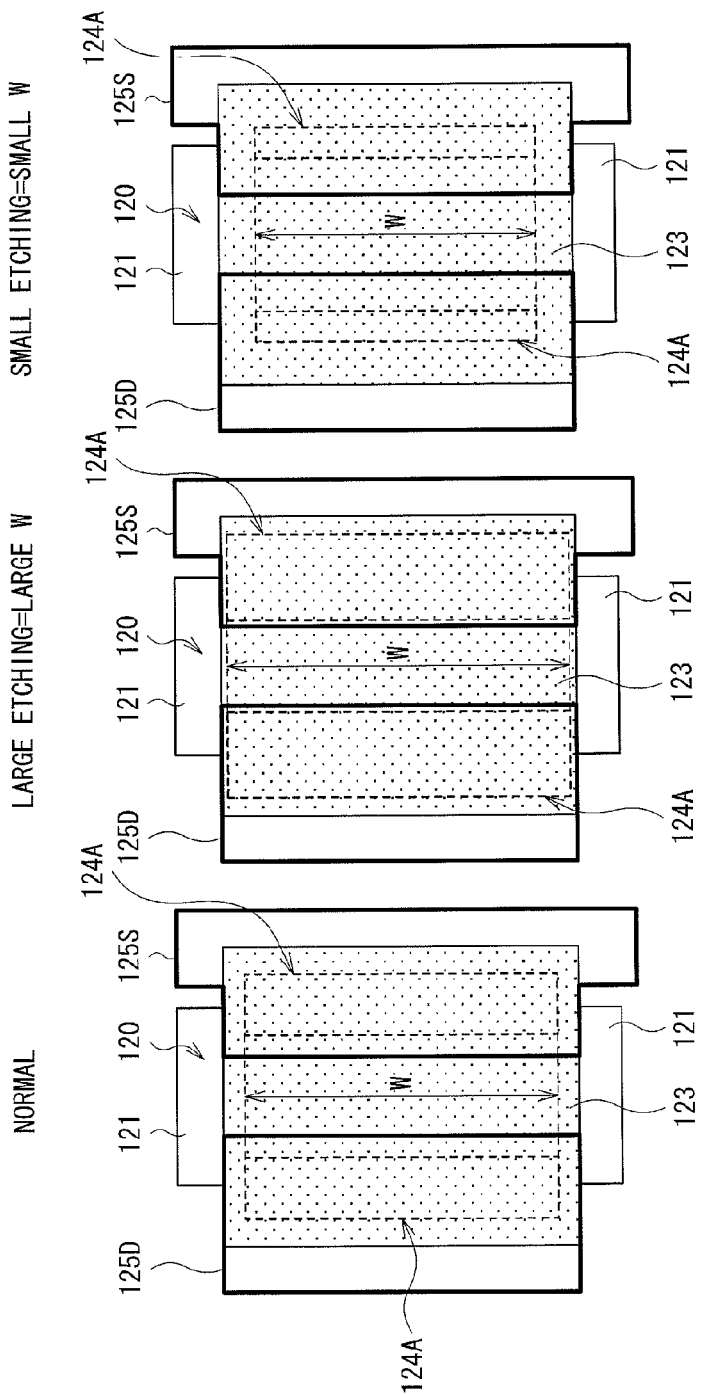
FIGS. 10A to 10C are plan views for describing a disadvantage of a thin-film transistor in related art.

On the other hand, in related art, as illustrated in FIG. 10A, a channel width W of a TFT 120 is determined by a width of a connection hole 124A formed in a channel protective layer (not illustrated). Therefore, as illustrated in FIG. 10B, when the etching amount of the connection hole 124A is increased, the channel width W of the TFT 120 is increased. On the other hand, as illustrated in FIG. 10C, when the etching amount of the connection hole 124A is reduced, the channel width W of the TFT 120 is reduced. In other words, the channel width W of the TFT 120 varies due to variations in etching of the channel protective layer (not illustrated). It is to be noted that, components in FIGS. 10A to 10C corresponding to components of the TFT 20 illustrated in FIG. 4 are given the same numerals incremented by 100. Moreover, in FIGS. 10A to 10C, the region where the channel protective layer is disposed is not shaded (refer to FIG. 4).

After the source electrode 25S and the drain electrode 25D illustrated in FIG. 9 are formed, the recovery annealing (oxygen supply) process on the oxide semiconductor layer 23 is performed. Thus, a defect developed in the oxide semiconductor layer 23 during the manufacturing process is recovered. Here, the protruding portions 23D protruding from the source electrode 25S and the drain electrode 25D are disposed at four corners, which surround the narrow region 23B, of the wide regions 23C. Therefore, the protruding portions 23D serve as oxygen inlets, allowing transistor characteristics to be efficiently recovered for a short time.

Thus, the TFT substrate 1 including the TFTs 20 illustrated in FIG. 3 is formed.
(Forming Organic Light-emitting Devices 10R, 10G, and 10B)

Next, the display region 110 configured of the organic light-emitting devices 10R, 10G, and 10B is formed above the TFTs 20. In other words, first, an entire surface of the TFT substrate 1 is coated with a photosensitive resin, and the photosensitive resin is subjected to exposure and development to form the planarization insulating film 51 and the connection holes 51A, and then the planarization insulating film 51 is baked. Next, the anodes 52 made of the above-described material are formed by, for example, DC sputtering, and are selectively etched with use of, for example, lithography to be patterned into a predetermined shape. Next, the inter-electrode insulating film 53 made of the above-described material with the above-described thickness is formed by, for example, a CVD method, and openings are formed in the inter-electrode insulating film 53 with use of, for example, lithography. After that, the organic layer 54 and the cathode 55 made of the above-described materials are formed in order by, for example, an evaporation method to form the organic light-emitting devices 10R, 10G, and 10B. Next, the organic light-emitting devices 10R, 10G, and 10B are covered with the protective film 56 made of the above-described material.

After that, the adhesive layer 60 is formed on the protective film 56. Then, the sealing substrate 71 on which the color filter 72 and the light-shielding film 73 are disposed and which is made of the above-described material is prepared to be bonded to the TFT substrate 1 with the adhesive layer 60 in between. Thus, the display unit illustrated in FIG. 6 is completed.

In the display unit, the sampling transistor 3A is brought into conduction based on the control signal supplied from the scanning line WSL to sample a signal potential of an image signal supplied from the signalling DTL and then to retain the signal potential in the retention capacitor 3C. A current is supplied to the driving transistor 3B from the power supply line DSL which is maintained at a power supply potential, and a drive current is supplied to the light-emitting device 3D (the organic light-emitting device 10R, 10G, or 10B) based on the signal potential retained in the retention capacitor 3C. The light-emitting device 3D (the organic light-emitting device 10R, 10G, or 10B) emits light with luminance according to the signal potential of the image signal by the drive current supplied from the driving transistor 3B. The light passes through the cathode 55, the color filter 72, and the sealing substrate 71 to be extracted.

Since the narrow region 23B with a narrower width than that of the connection hole 24A is disposed in a part of the channel region 23A of the oxide semiconductor layer 23, the channel width W of the TFT 20 is determined by the width W23 of the narrow region 23B, and variations in the channel width W are suppressed. Therefore, variations in transistor characteristics caused by variations in the channel width W are reduced to suppress a decline in display quality such as luminance unevenness.

Thus, in the embodiment, the narrow region 23B with a narrower width than that of the connection hole 24A is disposed in a part of the channel region 23A; therefore, the influence of variations in the width W24 of the connection hole 24A caused by variations in etching of the channel protective layer 24 is eliminated, and the channel width W is dimensionally stabilized accordingly. Therefore, variations in transistor characteristics due to variations in the channel width W are reduced to enhance display quality.

Moreover, the protruding portions 23D protruding from the source electrode 25S and the drain electrode 25D are disposed at four corners, which surround the narrow region 23B, of the wide regions 23C as regions other than the narrow region 23B; therefore, in the recovery annealing (oxygen supply) process on the oxide semiconductor layer 23, oxygen is supplied from the protruding portions 23D to recover the transistor characteristics for a short time.
(Modification 1)

It is to be noted that, in the above-described embodiment, the case where the protruding portions 23D are disposed at four corners, which surround the narrow region 23B, of the wide regions 23C is described; however, the protruding portion 23D may be disposed at one or more corners or one or more sides of each of the wide regions 23C, and the arrangement of the protruding portions 23D is not specifically limited.

Figure 11:
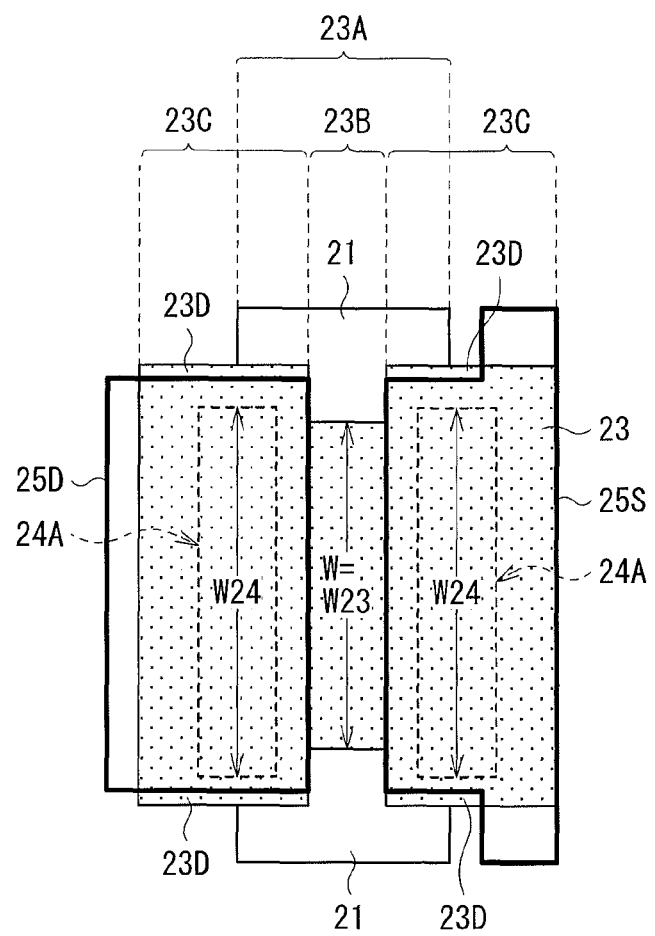
FIG. 11 is a plan view illustrating a configuration of a thin-film transistor according to Modification 1.

For example, as illustrated in FIG. 11, the protruding portions 23D may be disposed on both sides, which face each other in the channel width direction, of each of the wide regions 23C. In this modification, the protruding portions 23D are disposed on four sides of the wide regions 23C; therefore, in the recovery annealing (oxygen supply) process on the oxide semiconductor layer 23, oxygen supply efficiency is enhanced, and transistor characteristics are recovered for a shorter time. It is to be noted that, in FIG. 11 and following drawings, a region where the channel protective layer 24 is disposed is not shaded (refer to FIG. 4).

(Modification 2)

Figure 12:
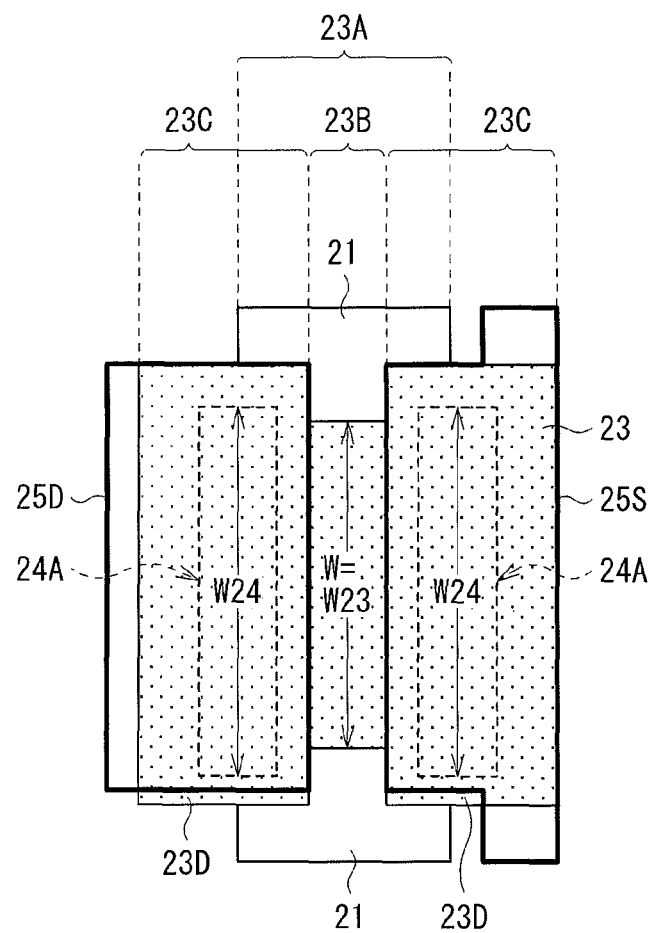
FIG. 12 is a plan view illustrating a configuration of a thin-film transistor according to Modification 2.

Moreover, for example, as illustrated in FIG. 12, the protruding portion 23D may be disposed on one (for example, a bottom side) of sides, which face each other in the channel width direction, of each of the wide regions 23C. In this modification, the protruding portions 23D are disposed on two sides of the wide regions 23C; therefore, as in Modification 1, in the recovery annealing (oxygen supply) process on the oxide semiconductor layer 23, oxygen supply efficiency is enhanced, and transistor characteristics are recovered for a shorter time.

It is to be noted that, although not illustrated, the protruding portions 23D may be disposed on a top side of the sides, which face each other in the channel width direction, of each of the wide regions 23C.

(Modification 3)

Figure 13:
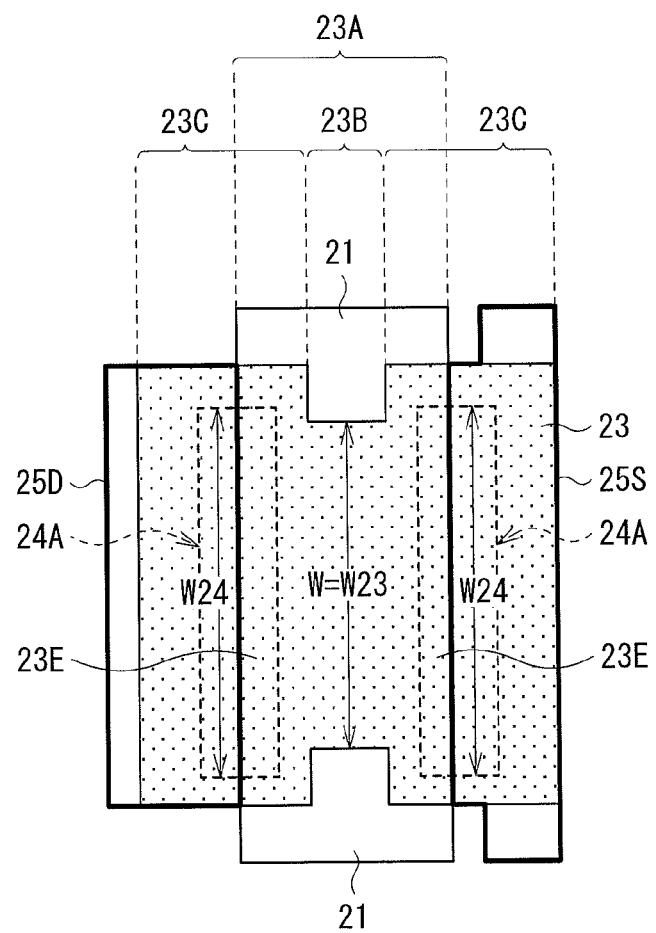
FIG. 13 is a plan view illustrating a configuration of a thin-film transistor according to Modification 3.

Further, for example, in the above-described embodiment, the case where the source electrode 25S and the drain electrode 25D fill in the entire connection holes 24A is described; however, as illustrated in FIG. 13, an edge of the source electrode 25S and an edge of the drain electrode 25D may be disposed in the connection holes 24A. In this case, the oxide semiconductor layer 23 has exposed portions 23E exposed from the channel protective layer 24, the source electrode 25S, and the drain electrode 25D in parts of the connection holes 24A. Like the protruding portions 23D, the exposed portions 23E may serve as oxygen inlets in the recovery annealing (oxygen supply) process on the oxide semiconductor layer 23. Therefore, transistor characteristics are efficiently recovered for a short time.

It is to be noted that, in this modification, the oxide semiconductor layer 23 is preferably made of a crystalline oxide semiconductor such as zinc oxide (ZnO), indium zinc oxide (IZO (registered trademark)), indium gallium oxide (IGO), ITO, or indium oxide (InO), because etching selectivity with respect to the source electrode 25S and the drain electrode 25D is able to be increased.

(Modification 4)

Figure 14:
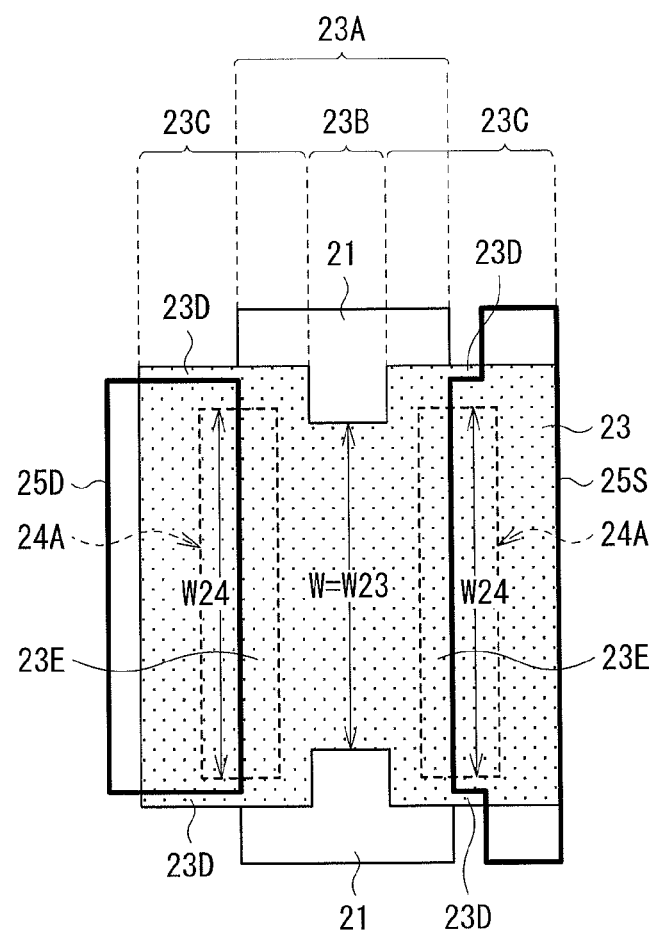
FIG. 14 is a plan view illustrating a configuration of a thin-film transistor according to Modification 4.

In addition, for example, as illustrated in FIG. 14, a combination of Modification 1 and Modification 3 may be used. In other words, the oxide semiconductor layer 23 may have the protruding portions 23D and the exposed portions 23E. It is to be noted that, although not illustrated, a combination of Modification 2 and Modification 3 may be used.

(Second Embodiment)

Figure 15:
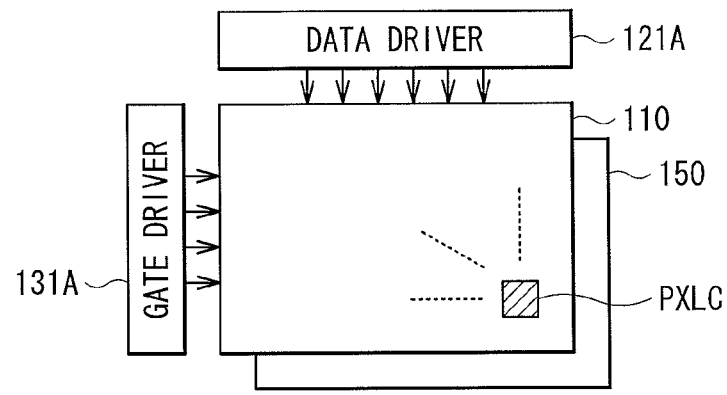
FIG. 15 is a diagram illustrating a configuration of a display unit according to a second embodiment of the disclosure.

FIG. 15 illustrates an entire configuration of a display unit according to a second embodiment of the disclosure. The display unit is used as a liquid crystal television or the like, and has, on the above-described TFT substrate 1, the display region 110 in which pixels PXLC configured of a plurality of liquid crystal display devices 10L which will be described later as display devices are arranged in a matrix. A data driver 121A as a signal section, and a gate driver 131A as a scanner section are disposed around the display region 110. An illumination section 150 as a backlight unit is disposed on a backside of the display region 110.

Figure 16:
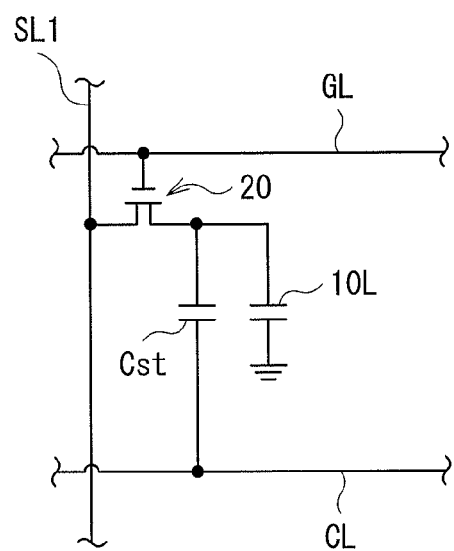
FIG. 16 is a diagram illustrating an equivalent circuit of a pixel illustrated in FIG. 15.

FIG. 16 illustrates an equivalent circuit of the pixel PXLC. The pixel PXLC includes the TFT 20 described in the first embodiment, the liquid crystal display device 10L, and a capacitor Cst.

The TFT 20 has a function as a switching device supplying an image signal to the pixel PXLC, and has a configuration similar to the TFT 20 in the first embodiment. A gate of the TFT 20 is connected to a gate bus line GL extending in a horizontal direction. A source bus line SL extending in a vertical direction is disposed orthogonal to the gate bus line GL. A source of the TFT 20 is connected to the source bus line SL, and a drain of the TFT 20 is connected to one end of the liquid crystal display device 10L and one end of the capacitor Cst.

The liquid crystal display device 10L has a function as a display device performing an operation for display based on a signal voltage supplied through the TFT 20. The other end of the liquid crystal display device 10L is grounded.

The capacitor Cst generates a potential difference between both ends thereof, and more specifically, the capacitor Cst includes a dielectric accumulating a charge. The other end of the capacitor Cst is connected to a capacitor bus line CL extending parallel to the gate bus line GL, that is, in the horizontal direction.

Figure 17:
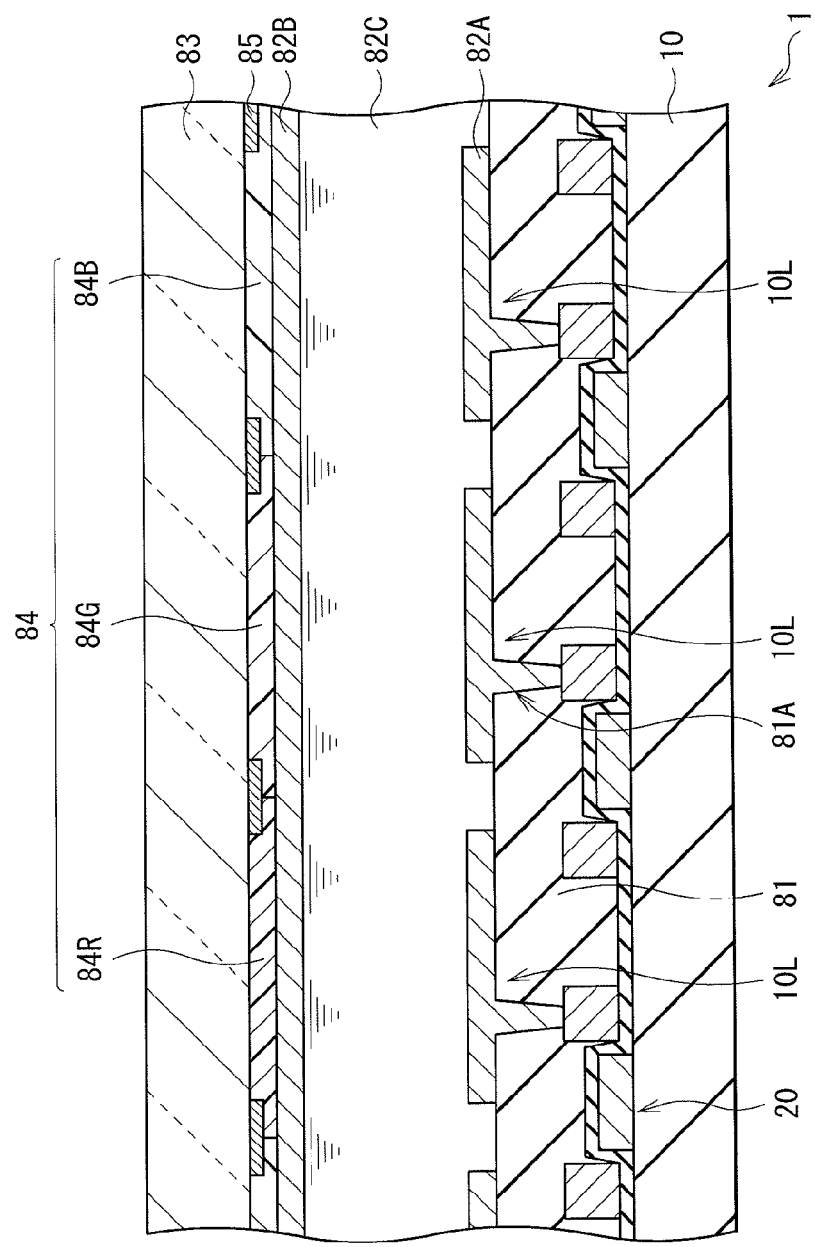
FIG. 17 is a sectional view illustrating a configuration of a display region illustrated in FIG. 15.

FIG. 17 illustrates a sectional configuration of the display region 110. As in the first embodiment, the TFT substrate 1 includes the TFTs 20 including the oxide semiconductor layer 23 (refer to FIG. 3) on the substrate 10. Each of the liquid crystal display devices 10L includes a pixel electrode 82A made of, for example, ITO on a planarization insulating film 81. Moreover, a color filter 84 configured of red filters 84R, green filters 84G, and blue filters 84B, a light-shielding film 85, and a common electrode 82B made of, for example, ITO are disposed on a counter substrate 83. A liquid crystal layer 82C is disposed between the pixel electrodes 82A and the common electrode 82B. It is to be noted that the capacitor Cst is not illustrated in FIG. 17.

The planarization insulating film 81 has a configuration similar to the planarization insulating film 51 in the first embodiment. The TFT 20 is connected to the pixel electrode 82A through a connection hole 81A formed in the planarization insulating film 81.

The display unit may be manufactured by the following process, for example.

(Forming TFT Substrate 1)

First, in a manner similar to the first embodiment, the TFTs 20 including the oxide semiconductor layer 23 are formed on the substrate 10 to form the TFT substrate 1.

(Forming Liquid Crystal Display Device 10L)

Next, the display region 110 configured of the liquid crystal display devices 10L is formed above the TFTs 20. In other words, first, an entire surface of the TFT substrate 1 is coated with a photosensitive resin, and the photosensitive resin is subjected to exposure and development to form the planarization insulating film 81 and the connection holes 81A, and then the planarization insulating film 81 is baked. Next, the pixel electrodes 82A made of the above-described material are formed by, for example, DC sputtering, and are selectively etched with use of, for example, lithography to be patterned into a predetermined shape.

Moreover, the color filter 84, the light-shielding film 85, and the common electrode 82B made of the above-described material are formed on the counter substrate 83, and the TFT substrate 1 and the counter substrate 83 are bonded together with a sealing frame (not illustrated) in between. After that, a liquid crystal is injected from an opening (not illustrated) of the sealing frame to form the liquid crystal layer 82C between the pixel electrodes 82A and the common electrode 82B, and the opening is sealed. Thus, the display unit illustrated in FIG. 17 is completed.

In the display unit, light from the illumination section 150 is uniformly diffused by an optical sheet (not illustrated) to enter each of the liquid crystal display devices 10L. The incident light passes through the liquid crystal layer 82C while being modulated in each pixel based on an image voltage applied between each of the pixel electrodes 82A and the common electrode 82B. The light having passed through the liquid crystal layer 82C passes through the color filter 84 to exit from the counter substrate 83 as color display light.

Functions and effects in this embodiment are similar to those in the first embodiment.

(Third Embodiment)

Figure 18:
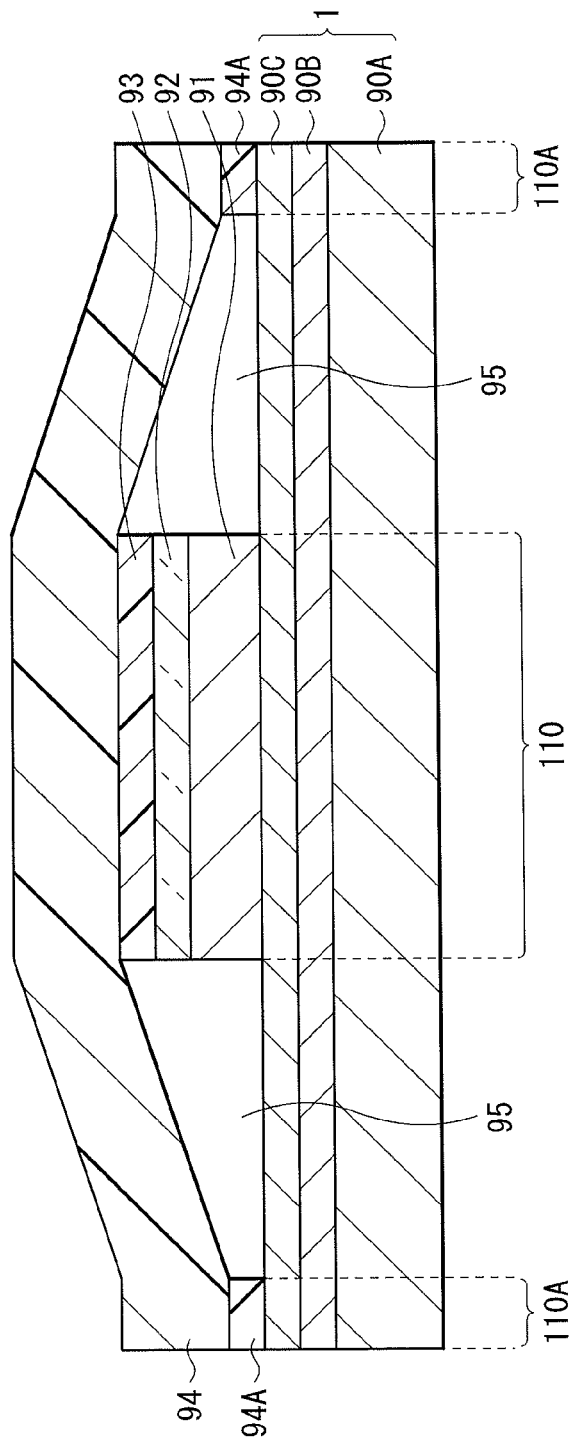
FIG. 18 is a sectional view illustrating a configuration of a display unit according to a third embodiment of the disclosure.

FIG. 18 illustrates a sectional configuration of a display unit according to a third embodiment of the disclosure. The display unit is an electrophoretic display unit (a so-called electronic paper display unit) displaying an image (for example, textual information) with use of an electrophoresis phenomenon, and includes a display layer 91, a counter substrate 92, a transparent adhesive layer 93, and a protective film 94 in this order on the TFT substrate 1. It is to be noted that FIG. 18 schematically illustrates a shape of the display unit, and dimensions and shapes in FIG. 18 are different from actual dimensions and shapes.

Figure 19:
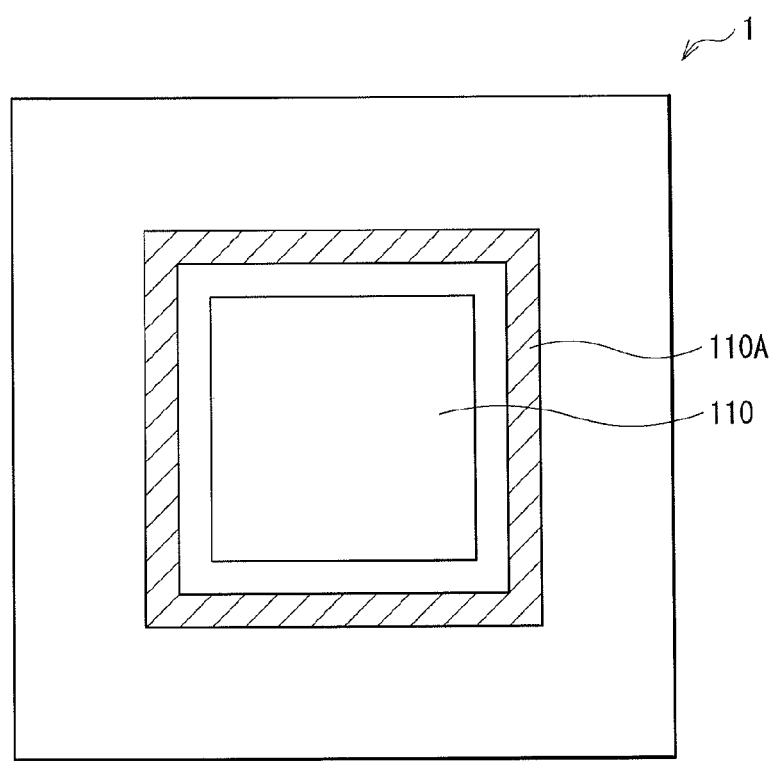
FIG. 19 is a plan view illustrating a configuration of a drive substrate illustrated in FIG. 18.

As illustrated in FIG. 19, in the TFT substrate 1, an adhesive region 110A is disposed around the display region 110 located at a center of the TFT substrate 1 to completely surround the display region 110. The display layer 91 is disposed on the display region 110, and an edge of the protective film 94 is adhered to the adhesive region 110A by an adhesive layer 94A.

The TFT substrate 1 includes a barrier layer 90B and a TFT (Thin-Film Transistor) circuit 90C laminated in this order on a base 90A. The base 90A is made of, for example, an inorganic material such as glass, quartz, silicon, or gallium arsenide, a metal material such as stainless steel, or a plastic material such as polyimide, polyethylene terephthalate (PET), polyethylene naphthalate (PEN), polymethyl methacrylate (PMMA), polycarbonate (PC), polyether sulfone (PES), polyethyletherketone (PEEK), aromatic polyester (liquid crystal polymer). The base 90A may be a base with stiffness such as a wafer, or a base with flexibility such as thin-layer glass, a film, or metal foil. When the base 90A has flexibility, a flexible display unit is achievable. The base 90A has, for example, a thickness (a thickness in a laminate direction, hereinafter simply referred to as "thickness") of about 10 μm to 100 μm both inclusive.

The barrier layer 90B is an $AlO_xN_{1-x}$ film, where X is 0.01 to 0.2, or a silicon nitride ($Si_3N_4$) film formed by, for example, a CVD method, and suppresses degradation in the TFT circuit 90C and the display layer 91 caused by moisture or an organic gas. The barrier layer 90B is formed by a CVD method in many cases, and compared to the case where the barrier layer 90B is formed by an evaporation method, the barrier layer 90B formed by CVD is dense and has lower moisture permeability.

The TFT circuit 90C has a switching function for selecting a pixel. The TFT circuit 90C is configured of the TFTs 20 described referring to FIG. 3 in the first embodiment.

Figure 20:
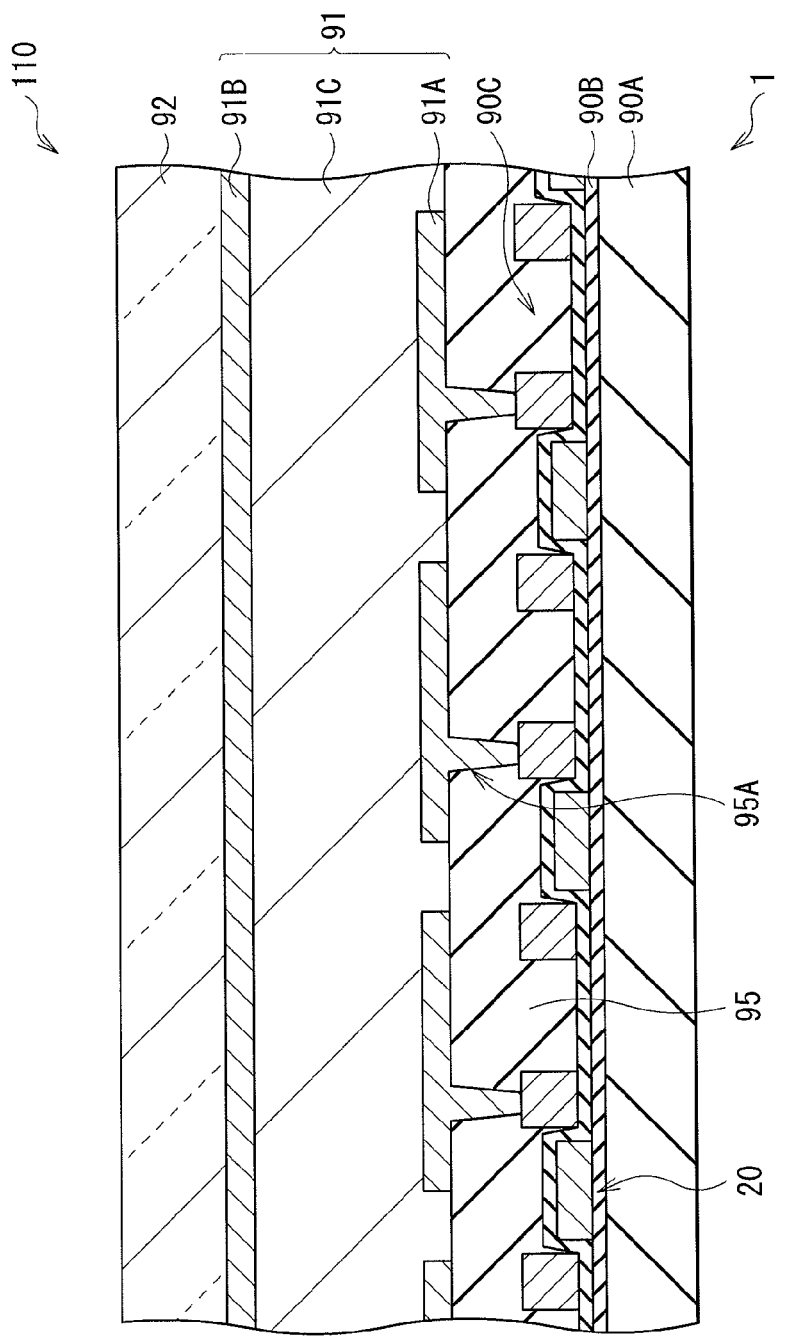
FIG. 20 is a sectional view illustrating a configuration of a display region illustrated in FIG. 19.

FIG. 20 illustrates a sectional configuration of the display region 110 illustrated in FIG. 19. The display layer 91 includes an electrophoretic display body 91C between pixel electrodes 91A and a common electrode 91B. Each of the pixel electrodes 91A is connected to the TFT circuit 90C through a connection hole 95A of a planarization insulating film 95. The display layer 91 has, for example, a thickness in the laminate direction of about 40 μm to 165 μm both inclusive. Each of the pixel electrodes 91A is disposed for each pixel, and is made of, for example, a simple substance or an alloy of a metal element such as chromium (Cr), gold (Au), platinum (Pt), nickel (Ni), copper (Cu), tungsten (W), aluminum (Al), or silver (Ag). The common electrode 91B is disposed on one entire surface of the counter substrate 92, and is made of, for example, a translucent conductive material (a transparent electrode material) such as indium oxide-tin oxide (ITO), antimony oxide-tin oxide (ATO), fluorine-doped tin oxide (FTO), or aluminum-doped zinc oxide (AZO).

The counter substrate 92 is disposed on the display region 110 in a manner similar to the display layer 91, and has, for example, a thickness of about 125 μm. In this embodiment, an image is displayed on the counter substrate 92; therefore, a light-transmissive material is used for the counter substrate 92, and except for this, a material similar to that of the base 90A may be used for the counter substrate 92.

The protective film 94 seals the display layer 91. The protective film 94 has, in addition to a moisture-proof function, an optical function such as an antireflection function or an anti-glare function, and a protection function against external force, and has, for example, a thickness of about several hundreds of μm.

The protective film 94 is fixed to the counter substrate 92 by the transparent adhesive layer 93. The transparent adhesive layer 93 is made of an OCA (Optical Clear Adhesive) or the like with a thickness of about 25 μm. When the base 90A is configured of a flexible substrate, the transparent adhesive layer 93 is preferably also flexible.

A gap 95 is disposed between the display region 110 and the adhesive region 110A which are sealed by the protective film 94 (between side surfaces of the display layer 91 and the counter substrate 92, and the protective film 94), and the side surfaces of the display layer 91 and the counter substrate 92 are surrounded by the gap 95.

The display unit may be manufactured by the following process, for example.

(Forming TFT Substrate 1)

Figure 21A:
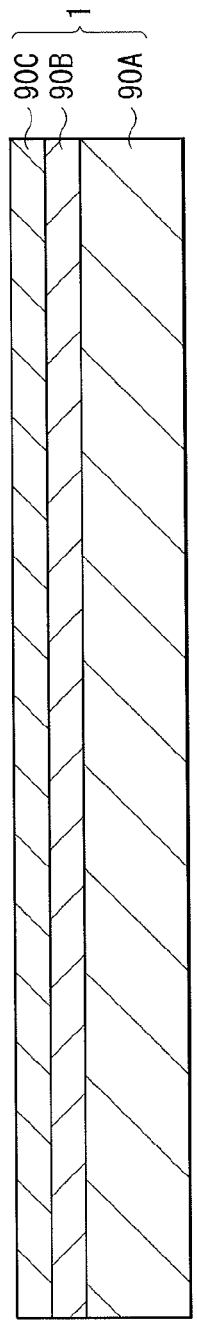
FIGS. 21A and 21B are sectional views illustrating a method of manufacturing the display unit illustrated in FIG. 18 in sequence.
Figure 21B:
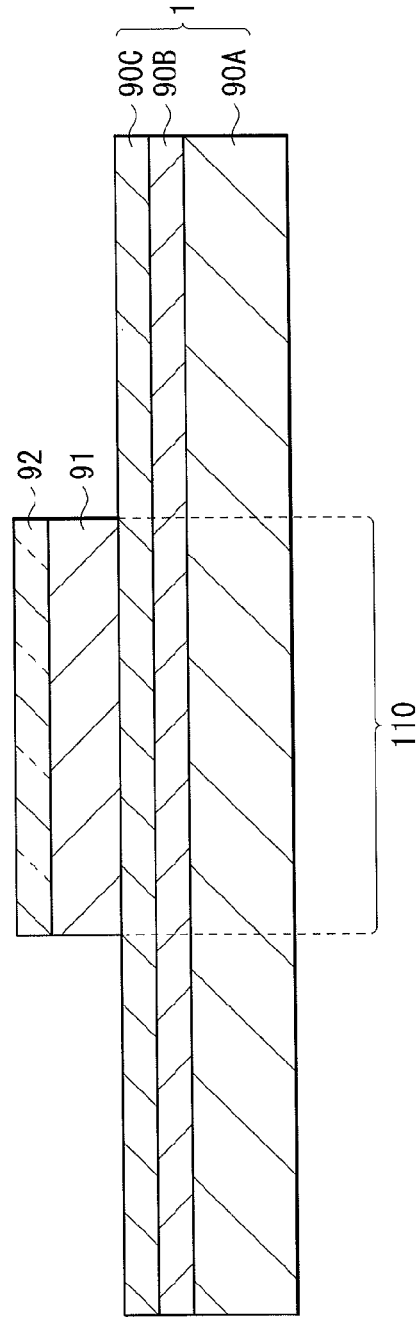

FIGS. 21A and 21B illustrates a method of manufacturing the display unit in sequence. First, as illustrated in FIG. 21A, the barrier layer 90B made of silicon nitride is formed on the base 90A by, for example, a CVD method. Next, referring again to FIG. 21A, the TFT circuit 90C configured of the TFTs 20 including the oxide semiconductor layer 23 is formed on the barrier layer 90B to form the TFT substrate 1. The TFTs 20 may be formed in a similar manner to the first embodiment.

(Forming Electrophoretic Display Layer 91)

After the TFT substrate 1 is formed, a metal film made of, for example, chromium, gold, platinum, nickel, copper, tungsten, aluminum, or silver is formed on an entire surface of the TFT substrate 1, and the metal film is patterned to form the pixel electrodes 91A.

Next, as illustrated in FIG. 21B, the display body 91C is formed on the counter substrate 92 including the common electrode 91B by, for example, coating, and then the counter substrate 92 is bonded to the TFT substrate 1. Thus, the display layer 91 and the counter substrate 92 are formed on the TFT substrate 1. The common electrode 91B is formed through forming a film made of, for example, ITO on one entire surface of the counter substrate 92.

After the counter substrate 92 is bonded, the protective film 94 is fixed on the counter substrate 92 by the transparent adhesive layer 93. At this time, the protective film 94 having all sides larger than all sides of the display region 110 and an area larger than that of the display region 110 is used. Thus, a portion protruding outside the display region 110 is formed in the protective film 94. Next, the portion protruding from the display region 110 of the protective film 94 is bended toward the TFT substrate 1 to be fixed to the adhesive region 110A of the TFT substrate 1 by the adhesive layer 94 to cover side surfaces of the display layer 91. Thus, the display unit illustrated in FIGS. 18 to 20 is completed.

In the display unit, display is performed by the electrophoretic display body 91C based on an image voltage applied between the pixel electrodes 91A and the common electrode 91B in the display layer 91.

Functions and effects in this embodiment are similar to those in the first embodiment.

APPLICATION EXAMPLES

Next, referring to FIGS. 22 to 29, application examples of the display units according to the above-described embodiments will be described below. The display units according to the above-described embodiments are applicable to electronic apparatuses, in any fields, such as televisions, digital cameras, notebook personal computers, portable terminal units such as cellular phones and smartphones, and video cameras. In other words, the display units are applicable to electronic apparatuses, in any fields, displaying an image signal supplied from outside or an image signal produced inside as an image or a picture.

(Module)

Figure 22:
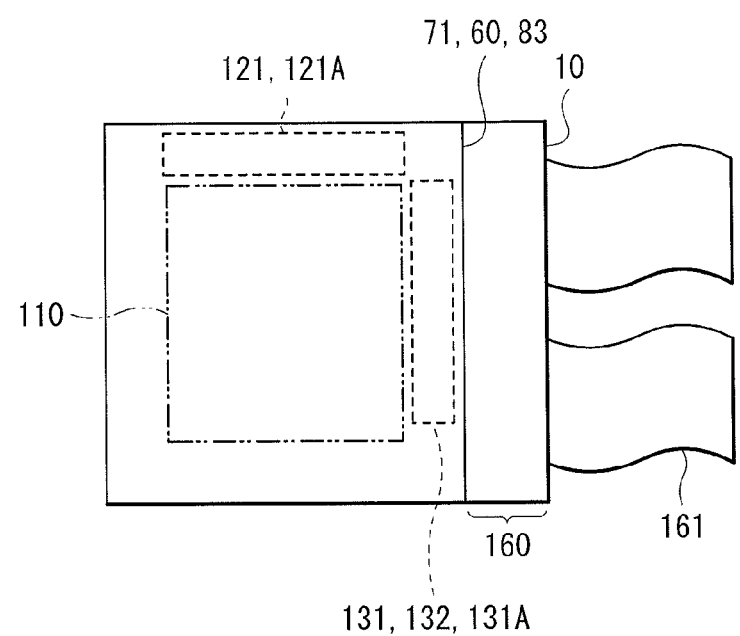
FIG. 22 is a plan view illustrating a schematic configuration of a module including any one of the display units according to the above-described embodiments.

Any one of the display units according to the above-described embodiments is incorporated into various electronic apparatuses such as Application Examples 1 to 7 which will be described later, for example, as a module as illustrated in FIG. 22. In the module, for example, a region 160 exposed from the sealing substrate 71 and the adhesive layer 60 in the first embodiment or from the counter substrate 83 in the second embodiment is provided on a side of the substrate 10, and an external connection terminal (not illustrated) is formed in the exposed region 160 through extending the wiring of the horizontal selector 121, the write scanner 131, and the power supply scanner 132 in the first embodiment or through extending the data driver 121A and the gate driver 131A in the second embodiment. A flexible printed circuit (FPC) 161 for signal input and output may be connected to the external connection terminal.

Application Example 1

Figure 23A:
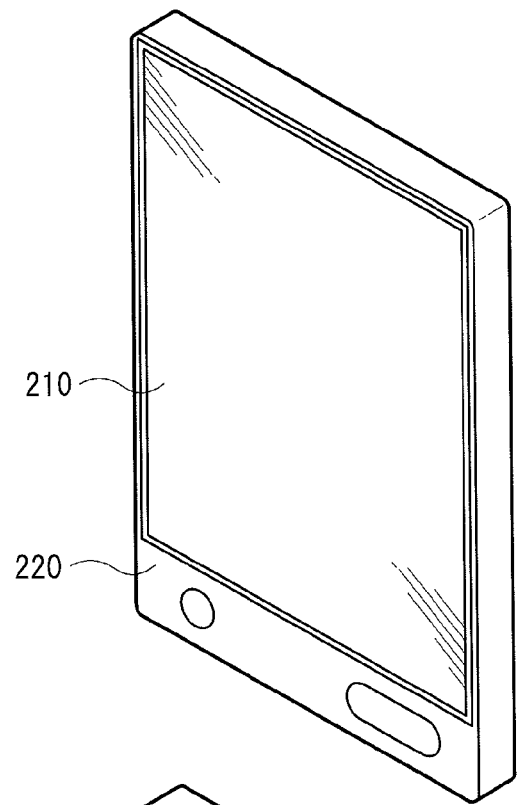
FIGS. 23A and 23B are perspective views illustrating an appearance of Application Example 1 of any one of the display units according to the above-described embodiments.
Figure 23B:
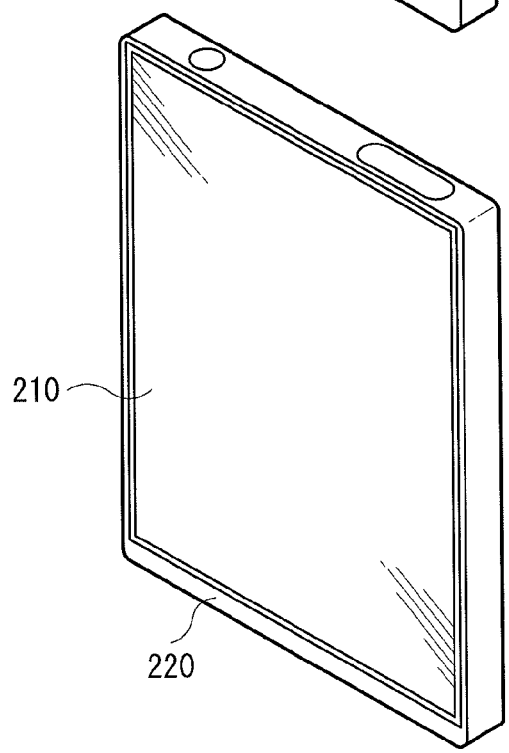

FIGS. 23A and 23B illustrate an appearance of an electronic book to which any one of the display units according to the above-described embodiments is applied. The electronic book includes a display section 210 and a non-display section 220, and the display section is configured of any one of the display units according to the above-described embodiments.

Application Example 2

Figure 24:
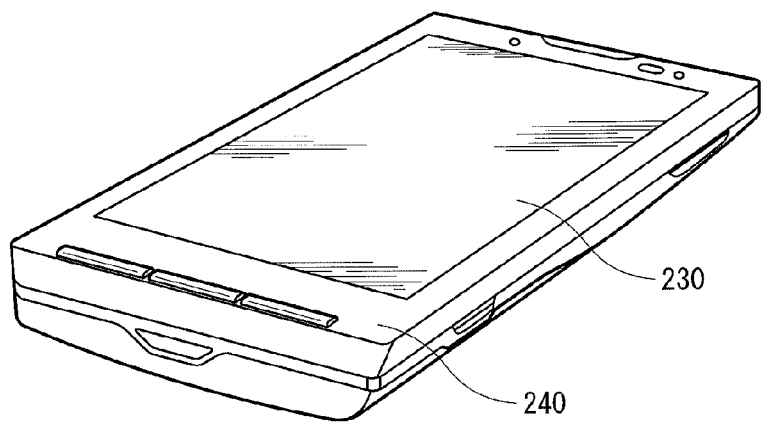
FIG. 24 is a perspective view illustrating an appearance of Application Example 2.

FIG. 24 illustrates an appearance of a smartphone to which any one of the display units according to the above-described embodiments is applied. The smartphone includes, for example, a display section 230 and a non-display section 240, and the display section 230 is configured of any one of the display units according to the above-described embodiments.

Application Example 3

Figure 25:
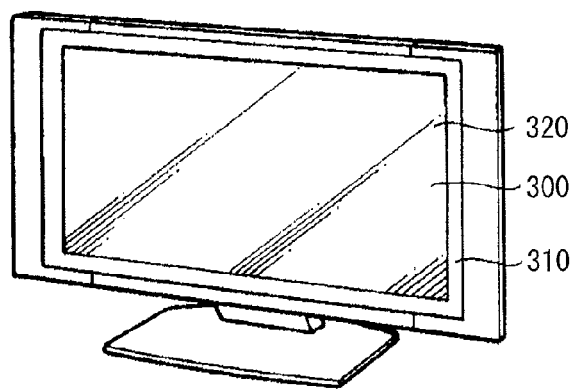
FIG. 25 is a perspective view illustrating an appearance of Application Example 3.

FIG. 25 illustrates an appearance of a television to which any one of the display units according to the above-described embodiments is applied. The television includes, for example, an image display screen section 300 including a front panel 310 and a filter glass 320, and the image display screen section 300 is configured of any one of the display units according to the above-described embodiments.

Application Example 4

Figure 26A:
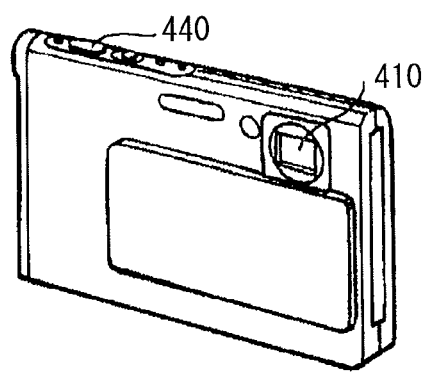
FIGS. 26A and 26B are perspective views illustrating an appearance of Application Example 4 from a front side and a back side, respectively.
Figure 26B:
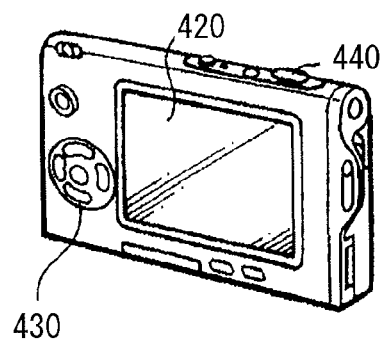

FIGS. 26A and 26B illustrate an appearance of a digital camera to which any one of the display units according to the above-described embodiments is applied. The digital camera includes, for example, a light-emitting section 410 for a flash, a display section 420, a menu switch 430, and a shutter button 440, and the display section 420 is configured of any one of the display units according to the above-described embodiments.

Application Example 5

Figure 27:
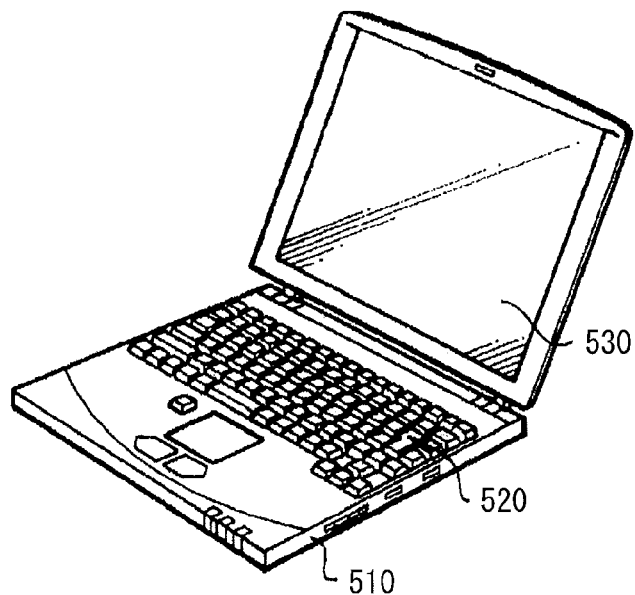
FIG. 27 is a perspective view illustrating an appearance of Application Example 5.

FIG. 27 illustrates an appearance of a notebook personal computer to which any one of the display units according to the above-described embodiments is applied. The notebook personal computer includes, for example, a main body 510, a keyboard 520 for operation of inputting characters and the like, and a display section 530 for displaying an image, and the display section 530 is configured of any one of the display units according to the above-described embodiments.

Application Example 6

Figure 28:
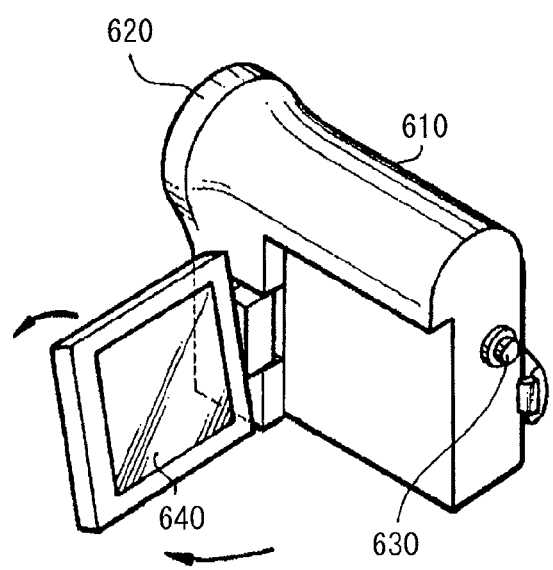
FIG. 28 is a perspective view illustrating an appearance of Application Example 6.

FIG. 28 illustrates an appearance of a video camera to which any one of the display units according to the above-described embodiments is applied. The video camera includes, for example, a main body 610, a lens 620 provided on a front surface of the main body 610 and for shooting an image of an object, a shooting start/stop switch 630, and a display section 640, and the display section 640 is configured of any one of the display units according to the above-described embodiments.

Application Example 7

FIGS. 29A to 29G illustrate an appearance of a cellular phone to which any one of the display units according to the above-described embodiments is applied. The cellular phone has a configuration in which, for example, a top-side enclosure 710 and a bottom-side enclosure 720 are connected together through a connection section (hinge section) 730, and the cellular phone includes a display 740, a sub-display 750, a picture light 760, and a camera 770. The display 740 or the sub-display 750 is configured of any one of the display units according to the above-described embodiments.

Although the present disclosure is described referring to the embodiments, the disclosure is not limited thereto, and may be variously modified. For example, in the above-described embodiments, the material and thickness of each layer, the method and conditions of forming each layer are not limited to those described in the above-described embodiments, and each layer may be made of any other material with any other thickness by any other method under any other conditions.

Moreover, in the above-described embodiments, specific configurations of the organic light-emitting devices 10R, 10B, and 10G are described; however, it is not necessary for the organic light-emitting devices 10R, 10B, and 10G to include all of the layers described in the embodiments, and the organic light-emitting devices 10R, 10B, and 10G may further include any other layer.

Further, the present disclosure is applicable to not only a display unit including the organic light-emitting devices but also a display unit including any other display devices such as liquid crystal display devices, inorganic electroluminescence devices, or electrodeposition or electrochromic display devices.

In addition, for example, specific configurations of the display units are described in the above-described embodiments; however, it is not necessary for the display units to include all of the components described in the embodiments, and the display units may further include any other component.

It is to be noted that the technology is allowed to have the following configurations.

(1) A thin-film transistor including:
a gate electrode;
a gate insulating film disposed on the gate electrode;
an oxide semiconductor layer disposed on the gate insulating film and having a channel region located to face the gate electrode;
a channel protective layer disposed on the gate insulating film and the oxide semiconductor layer; and
source and drain electrodes each connected to the oxide semiconductor layer through a connection hole formed in the channel protective layer,
in which the oxide semiconductor layer has, in a part of the channel region, a narrow region with a narrower width than a width of the connection hole.

(2) The thin-film transistor according to (1), in which the oxide semiconductor layer has a protruding portion protruding from the source and drain electrodes at one or more corners or one or more sides of a wide region which is a region other than the narrow region.

(3) The thin-film transistor according to (2), in which the protruding portion is disposed on each of four corners, which surround the narrow region, of the wide region.

(4) The thin-film transistor according to (2), in which the protruding portion is disposed on one or both of sides, which face each other in a channel width direction, of the wide region.

(5) The thin-film transistor according to any one of (1) to (4), in which the oxide semiconductor layer has, in a part of the connection hole, an exposed portion exposed from the channel protective layer and the source and drain electrodes.

(6) A display unit including a display device and a thin-film transistor driving the display device, the thin-film transistor including:
a gate electrode;
a gate insulating film disposed on the gate electrode;
an oxide semiconductor layer disposed on the gate insulating film and having a channel region located to face the gate electrode;
a channel protective layer disposed on the gate insulating film and the oxide semiconductor layer; and
source and drain electrodes each connected to the oxide semiconductor layer through a connection hole formed in the channel protective layer,
in which the oxide semiconductor layer has, in a part of the channel region, a narrow region with a narrower width than a width of the connection hole.

(7) An electronic apparatus with a display unit including a display device and a thin-film transistor driving the display device, the thin-film transistor including:
a gate electrode;
a gate insulating film disposed on the gate electrode;
an oxide semiconductor layer disposed on the gate insulating film and having a channel region located to face the gate electrode;
a channel protective layer disposed on the gate insulating film and the oxide semiconductor layer; and
source and drain electrodes each connected to the oxide semiconductor layer through a connection hole formed in the channel protective layer,
in which the oxide semiconductor layer has, in a part of the channel region, a narrow region with a narrower width than a width of the connection hole.

The present disclosure contains subject matter related to that disclosed in Japanese Priority Patent Application No. 2012-021502 filed in the Japan Patent Office on Feb. 3, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A thin-film transistor comprising:
a gate electrode;
a gate insulating film disposed on the gate electrode;
an oxide semiconductor layer disposed on the gate insulating film and having a channel region located to face the gate electrode;
a channel protective layer disposed on the gate insulating film and the oxide semiconductor layer; and
source and drain electrodes each connected to the oxide semiconductor layer through a connection hole formed in the channel protective layer,
wherein the oxide semiconductor layer has, in a part of the channel region disposed on the gate insulating film, a narrow region with a narrower width than a width of the connection hole and the oxide semiconductor layer has, in the part of the channel region, a narrow region with a narrower width than a width of the gate electrode.

2. The thin-film transistor according to claim 1, wherein the oxide semiconductor layer has a protruding portion protruding from the source and drain electrodes at one or more corners or one or more sides of a wide region which is a region other than the narrow region.

3. The thin-film transistor according to claim 2, wherein the protruding portion is disposed on each of four corners, which surround the narrow region, of the wide region.

4. The thin-film transistor according to claim 2, wherein the protruding portion is disposed on one or both of sides, which face each other in a channel width direction, of the wide region.

5. The thin-film transistor according to claim 1, wherein the oxide semiconductor layer has, in a part of the connection hole, an exposed portion exposed from the channel protective layer and the source and drain electrodes.

6. A display unit including a display device and a thin-film transistor driving the display device, the thin-film transistor comprising:
a gate electrode;

a gate insulating film disposed on the gate electrode;
an oxide semiconductor layer disposed on the gate insulating film and having a channel region located to face the gate electrode;
a channel protective layer disposed on the gate insulating film and the oxide semiconductor layer; and
source and drain electrodes each connected to the oxide semiconductor layer through a connection hole formed in the channel protective layer,
wherein the oxide semiconductor layer has, in a part of the channel region disposed on the gate insulating film, a narrow region with a narrower width than a width of the connection hole and the oxide semiconductor layer has, in the part of the channel region, a narrow region with a narrower width than a width of the gate electrode.

7. An electronic apparatus with a display unit including a display device and a thin-film transistor driving the display device, the thin-film transistor comprising:
a gate electrode;
a gate insulating film disposed on the gate electrode;
an oxide semiconductor layer disposed on the gate insulating film and having a channel region located to face the gate electrode;
a channel protective layer disposed on the gate insulating film and the oxide semiconductor layer; and
source and drain electrodes each connected to the oxide semiconductor layer through a connection hole formed in the channel protective layer,
wherein the oxide semiconductor layer has, in a part of the channel region disposed on the gate insulating film, a narrow region with a narrower width than a width of the connection hole and the oxide semiconductor layer has, in the part of the channel region, a narrow region with a narrower width than a width of the gate electrode.

8. The thin-film transistor according to claim 6, wherein the oxide semiconductor layer has a protruding portion protruding from the source and drain electrodes at one or more corners or one or more sides of a wide region which is a region other than the narrow region.

9. The thin-film transistor according to claim 8, wherein the protruding portion is disposed on each of four corners, which surround the narrow region, of the wide region.

10. The thin-film transistor according to claim 8, wherein the protruding portion is disposed on one or both of sides, which face each other in a channel width direction, of the wide region.

11. The thin-film transistor according to claim 6, wherein the oxide semiconductor layer has, in a part of the connection hole, an exposed portion exposed from the channel protective layer and the source and drain electrodes.

12. The thin-film transistor according to claim 7, wherein the oxide semiconductor layer has a protruding portion protruding from the source and drain electrodes at one or more corners or one or more sides of a wide region which is a region other than the narrow region.

13. The thin-film transistor according to claim 12, wherein the protruding portion is disposed on each of four corners, which surround the narrow region, of the wide region.

14. The thin-film transistor according to claim 12, wherein the protruding portion is disposed on one or both of sides, which face each other in a channel width direction, of the wide region.

15. The thin-film transistor according to claim 7, wherein the oxide semiconductor layer has, in a part of the connection hole, an exposed portion exposed from the channel protective layer and the source and drain electrodes.

* * * * *